(12) United States Patent
Mou et al.

(10) Patent No.: US 11,575,984 B2
(45) Date of Patent: Feb. 7, 2023

(54) EARPHONE

(71) Applicant: MICROJET TECHNOLOGY CO., LTD., Hsinchu (TW)

(72) Inventors: Hao-Jan Mou, Hsinchu (TW); Ta-Wei Hsueh, Hsinchu (TW); Yu-Tzu Chen, Hsinchu (TW); Chi-Feng Huang, Hsinchu (TW); Yung-Lung Han, Hsinchu (TW); Yang Ku, Hsinchu (TW); Yi-Ting Lu, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 17/335,317

(22) Filed: Jun. 1, 2021

(65) Prior Publication Data
US 2021/0392423 A1 Dec. 16, 2021

(30) Foreign Application Priority Data
Jun. 12, 2020 (TW) .................. 109119917

(51) Int. Cl.
| | |
|---|---|
| *H04R 1/10* | (2006.01) |
| *H04R 17/00* | (2006.01) |
| *H01L 41/09* | (2006.01) |
| *H04R 1/28* | (2006.01) |
| *F04B 43/04* | (2006.01) |

(52) U.S. Cl.
CPC .......... *H04R 1/105* (2013.01); *F04B 43/046* (2013.01); *H01L 41/0973* (2013.01); *H04R 1/1016* (2013.01); *H04R 1/1041* (2013.01); *H04R 1/1075* (2013.01); *H04R 1/2811* (2013.01);
(Continued)

(58) Field of Classification Search
CPC .... H04R 1/105; H04R 1/1016; H04R 1/1041; H04R 1/1075; H04R 1/2811; H04R 17/00; H04R 2460/11; H04R 1/2888; F04B 43/046; F04B 45/047; H01L 41/0973
See application file for complete search history.

(56) References Cited

U.S. PATENT DOCUMENTS

| | | | | |
|---|---|---|---|---|
| 2010/0111340 | A1* | 5/2010 | Miller | ..................... F16K 3/246 381/322 |
| 2013/0136285 | A1* | 5/2013 | Naumann | ............ H04R 25/656 381/329 |

(Continued)

FOREIGN PATENT DOCUMENTS

| | | |
|---|---|---|
| CN | 111202493 A | 5/2020 |
| TW | M581637 U | 8/2019 |

*Primary Examiner* — Oyesola C Ojo
(74) *Attorney, Agent, or Firm* — McClure, Qualey & Rodack, LLP

(57) ABSTRACT

An earphone includes an earphone body, a loudspeaker embedded on the wearing surface of the earphone body, a gas bag disposed on the base member of the earphone body, a gas actuator disposed on the base member of the earphone body, and a valve component having a valve unit. When the gas actuator and the valve component are driven, the valve unit is opened to control gas introduction of the gas actuator, and the gas actuator is actuated to transmit the gas to the ventilating channel for gas collection, and the gas actuator further transmits the gas to the gas bag for inflating the gas bag, so that the gas bag is expanded and protruded out of the wearing surface, thereby capable of allowing the earphone to be stably worn and attached to a user's ear portion.

9 Claims, 23 Drawing Sheets

(52) U.S. Cl.
CPC .......... *H04R 17/00* (2013.01); *H04R 2460/11* (2013.01)

(56) References Cited

U.S. PATENT DOCUMENTS

| | | | |
|---|---|---|---|
| 2013/0251172 A1* | 9/2013 | Mosseri | H04R 1/1083 381/74 |
| 2014/0238774 A1* | 8/2014 | Blendinger | H04R 1/1016 181/135 |
| 2015/0172801 A1* | 6/2015 | Huang | H04R 1/2849 381/380 |
| 2016/0008176 A1* | 1/2016 | Goldstein | A61F 11/10 128/864 |
| 2016/0050483 A1* | 2/2016 | Kulavik | H04R 1/1016 381/380 |
| 2020/0260197 A1* | 8/2020 | Thomsen | H04R 25/48 |

\* cited by examiner

EARPHONE

CROSS-REFERENCE TO RELATED APPLICATION

This non-provisional application claims priority under 35 U.S.C. § 119(a) to Patent Application No. 109119917 filed in Taiwan, R.O.C. on Jun. 12, 2020, the entire contents of which are hereby incorporated by reference.

BACKGROUND

Technical Field

The present disclosure relates to an earphone. In particular, to an earphone device that can be worn and positioned stably.

Related Art

In recent years, the demand of wearing earphones for mobile devices or gaming devices has increased. In particular, true wireless stereo (TWS) earphones refer to the earphone device can provide true wireless Bluetooth stereo effect, wherein the mobile device can be connected to the main headset of the earphone device through Bluetooth technology, and then the main headset can be connected to the secondary headset of the earphone device wirelessly, so that the left and right channels of the wireless Bluetooth earphone device can be used separately. At present, the earphones may be divided into earbud type earphones, in-ear type earphones, and hanging-on type earphones. The present earphones are desired to be worn and positioned comfortably and to provide active noise cancellation function to block environmental noise. Therefore, it is a main object of this invention to provide comfortability in wearing and positioning and to provide better acoustic insulation.

SUMMARY

One object of the present disclosure is to provide an earphone having the gas actuator for inflating the gas bag to perform the positioning function, so that the earphone can be stably positioned and worn on the ear portion of the user.

A general embodiment of the present disclosure provides an earphone including an earphone body, a loudspeaker, a gas bag, a gas actuator, and a valve component. The earphone body has a wearing surface, and an inner portion of the earphone body has a base member and a ventilating channel. The loudspeaker is embedded in the wearing surface of the earphone body. The gas bag is disposed on an outer periphery of the wearing surface and is in communication with the ventilating channel. The gas actuator is disposed on the base member of the earphone body, is electrically connected to the earphone body, and is in communication with the ventilating channel. When the gas actuator is driven, the gas actuator is actuated to transmit gas to the ventilating channel and performs a gas collecting operation. The valve component has at least one valve unit. The at least one valve unit is driven to be opened or closed to control the gas introduction procedure of the gas actuator. When the gas actuator and the valve component are driven, the at least one valve unit is opened to control the gas introduction procedure of the gas actuator, and the gas actuator is actuated to transmit the gas to the ventilating channel for gas collection, and the gas actuator further transmits the gas to the gas bag for inflating the gas bag, so that the gas bag is expanded and protruded out of the wearing surface of the earphone body, thereby allowing the earphone to be stably worn and attached to a user's ear portion.

BRIEF DESCRIPTION OF THE DRAWINGS

The disclosure will become more fully understood from the detailed description given herein below, for illustration only and thus not limitative of the disclosure, wherein.

DETAILED DESCRIPTION

The present disclosure will now be described more specifically with reference to the following embodiments. It is to be noted that the following descriptions of different embodiments of this disclosure are presented herein for purpose of illustration and description only, and it is not intended to limit the scope of the present disclosure.

Figure 1:
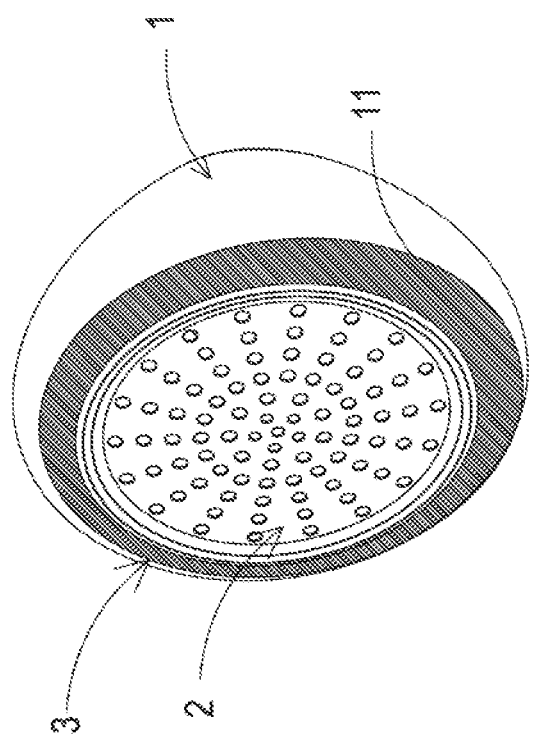
FIG. 1 illustrates a perspective view of an earphone according to an exemplary embodiment of the present disclosure.
Figure 2A:
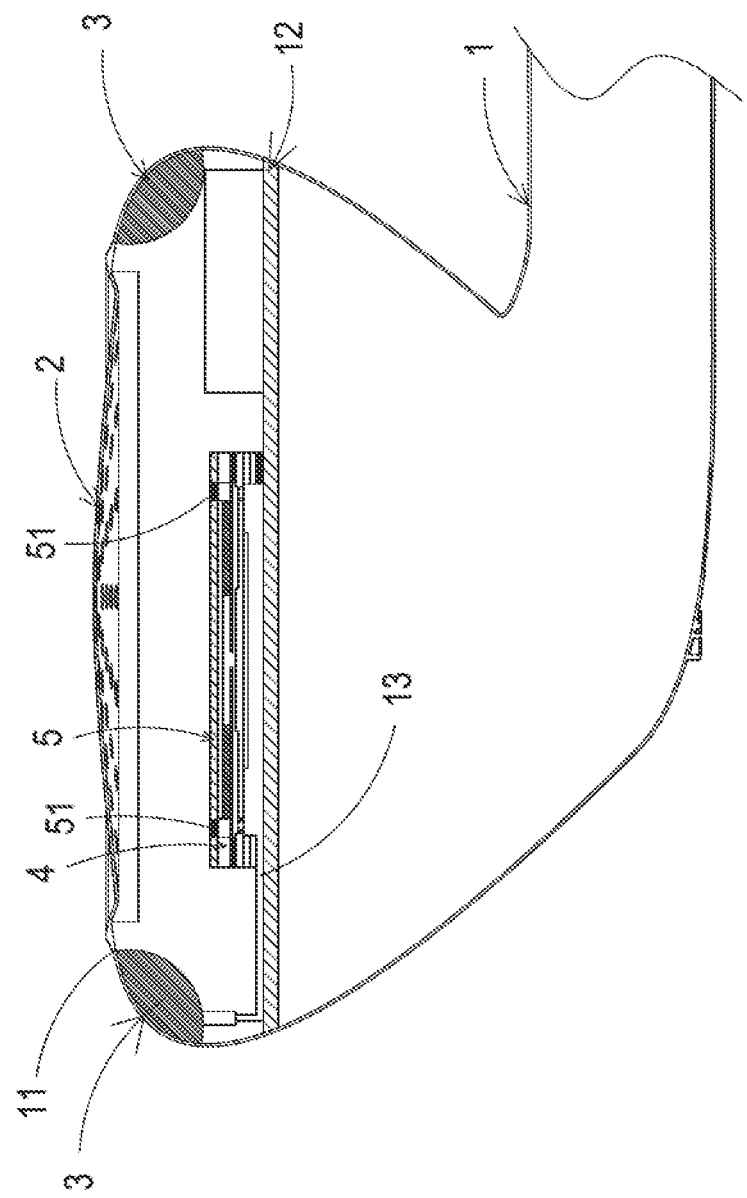
FIG. 2A illustrates a cross-sectional view of an earbud type earphone according to an exemplary embodiment of the present disclosure.
Figure 2B:
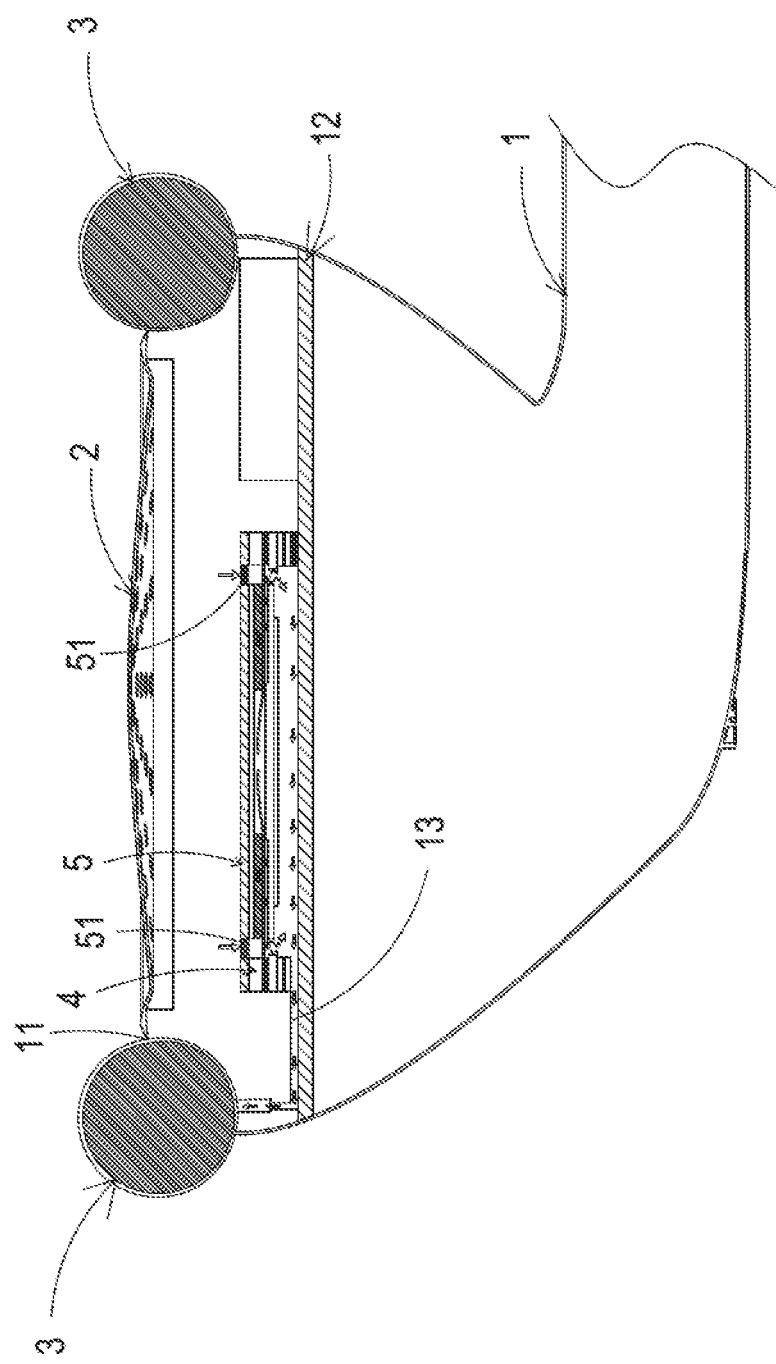
FIG. 2B illustrates a schematic view showing that a gas bag of the earbud type earphone is inflated according to the exemplary embodiment of the present disclosure.
Figure 3A:
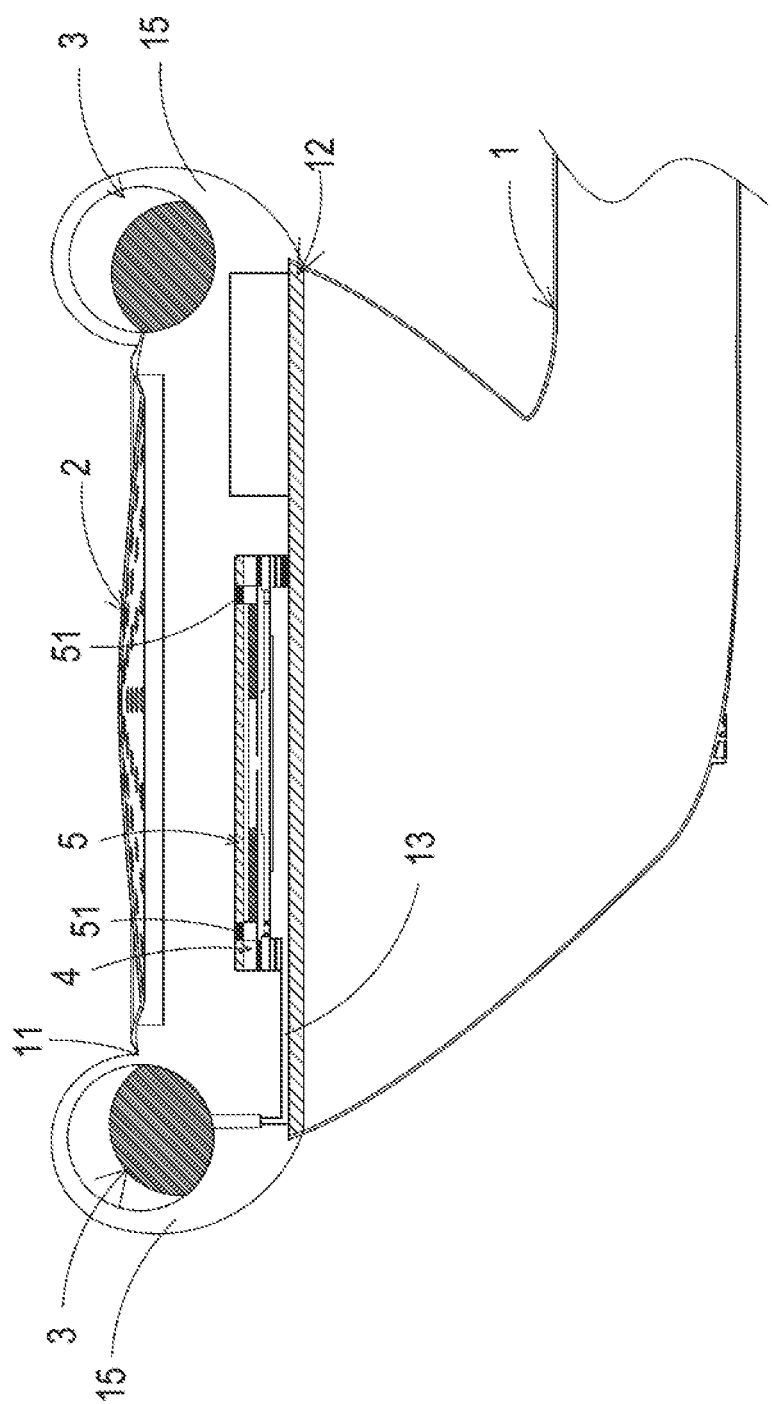
FIG. 3A illustrates a cross-sectional view of a hanging-on type earphone according to an exemplary embodiment of the present disclosure.
Figure 3B:
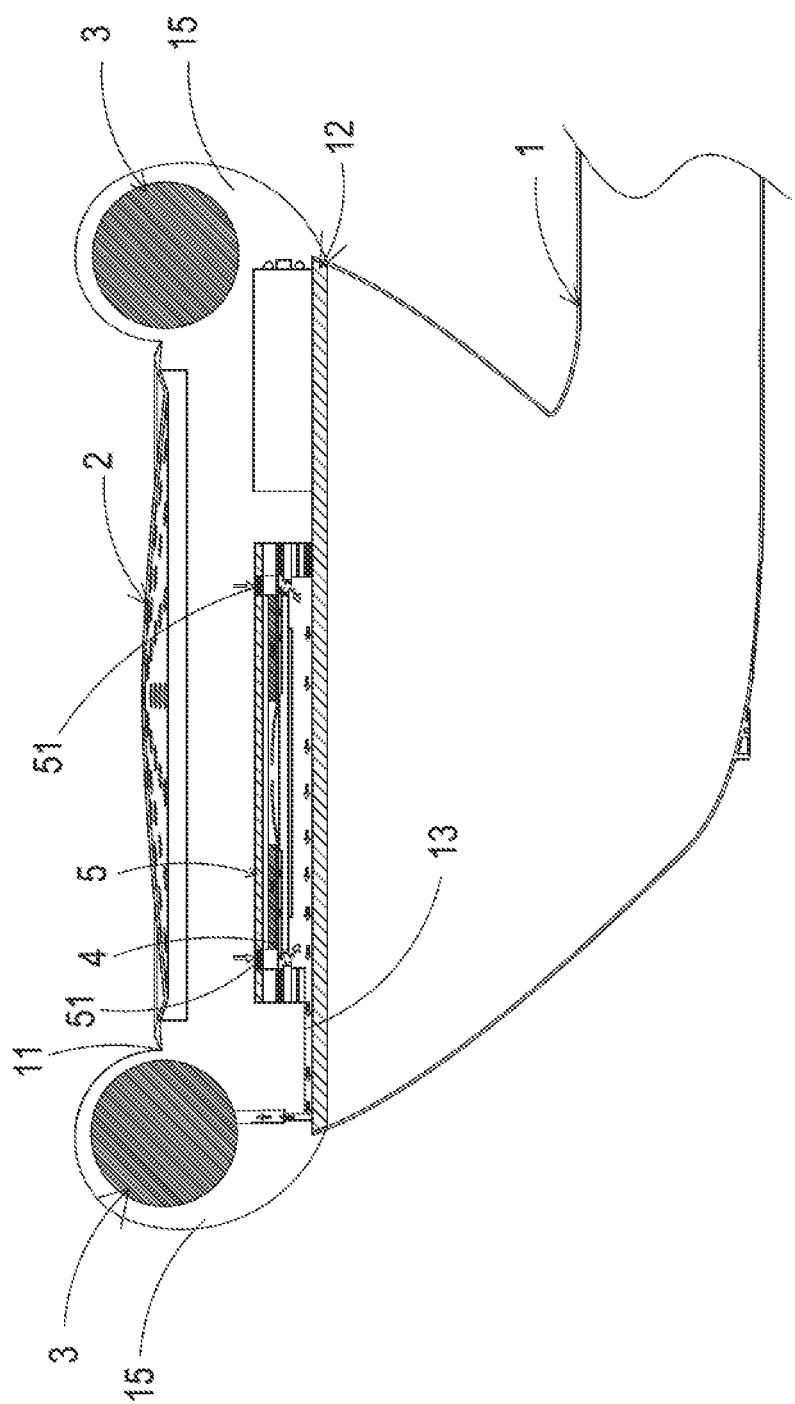
FIG. 3B illustrates a schematic view showing that a gas bag of the hanging-on type earphone is inflated according to the exemplary embodiment of the present disclosure.

Please refer to FIG. 1, FIG. 2A, FIG. 2B, FIG. 3A, and FIG. 3B. The earphone of the present disclosure can be worn and positioned on an ear portion of a user. The earphone may be an earbud type earphone as shown in FIG. 2A and FIG. 2B, or may be a hanging-on type earphone as shown in FIG. 3A and FIG. 3B. According to one or some embodiments of the present disclosure, an earphone including an earphone body 1, a loudspeaker 2, a gas bag 3, a gas actuator 4, and a valve component 5 is provided. The earphone body 1 has a wearing surface 11, and an inner portion of the earphone body 1 has a base member 12 and a ventilating channel 13. The loudspeaker 2 is embedded in the wearing surface 11 of the earphone body 1 for outputting sounds. The gas bag 3 is disposed on an outer periphery of the wearing surface 11 of the earphone body 1 and is in communication with the ventilating channel 13. The gas actuator 4 is disposed on the base member 12 of the earphone body 1, electrically connected to the earphone body 1, and in communication with the ventilating channel 13. When the gas actuator 4 is driven, the gas actuator 4 is actuated to transmit gas to the ventilating channel 13 to perform a gas collecting operation. The valve component 5 has a valve unit 51 driven to be opened or closed to control the gas introduction procedure of the gas actuator 4. Therefore, when the gas actuator 4 and the valve component 5 are driven, the valve unit 51 is opened to control the gas introduction procedure of the gas actuator 4, and the gas actuator 4 is actuated to transmit the gas to the ventilating channel 13 for gas collection, and the gas actuator 4 further transmits the gas to the gas bag 3 for inflating the gas bag 3, so that the gas bag 3 is expanded and protruded out of the wearing surface 11 of the earphone body 1, thereby allowing the earphone body 1 to be stably worn and attached to a user's ear portion.

In this embodiment, the base member 12 may be a driving circuit board, but not limited thereto. The base member 12 is provided for electrically connecting to the gas actuator 4 and the valve unit 51 of the valve component 5 and outputting a driving signal.

The operations of the valve unit 51 of the valve component 5 driven to be closed or opened to control the gas introduction procedure of the gas actuator 4 are provided in following paragraphs.

Figure 4A:
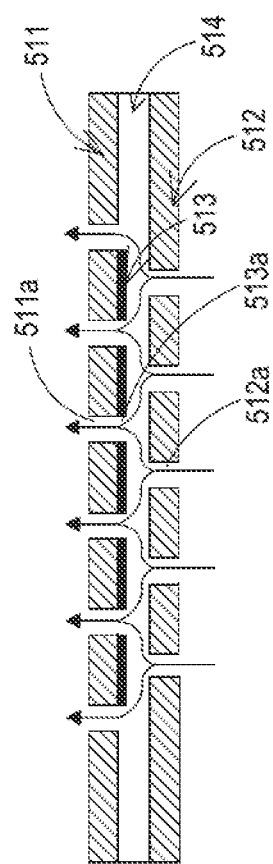
FIG. 4A illustrates a cross-sectional view of a valve unit of the earphone according to an exemplary embodiment of the present disclosure.
Figure 4B:
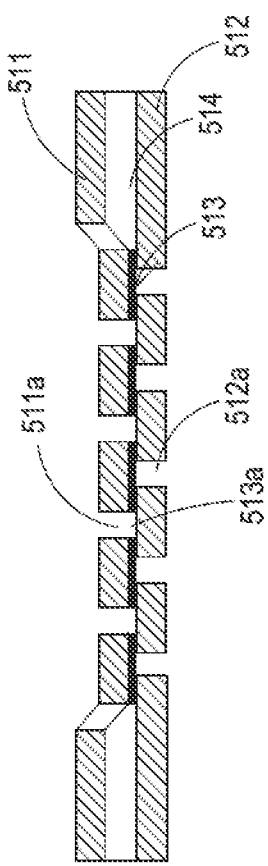
FIG. 4B illustrates a schematic view showing that the valve unit of the earphone is in a closed state according to the exemplary embodiment of the present disclosure.

Please refer to FIG. 1, FIG. 2A, FIG. 2B, FIG. 3A, FIG. 3B, FIG. 4A, and FIG. 4B. In this embodiment, the valve component 5 is covered on the gas actuator 4 and a valve unit 51 is correspondingly disposed on a gas entering portion of the gas actuator 4, so that the valve unit 51 is driven to be opened or closed to control the gas introduction procedure of the gas actuator 4. Further, as shown in FIG. 4A and FIG. 4B, the valve unit 51 includes a valve conductive layer 511, a valve substrate layer 512, and a flexible membrane 513. The valve conductive layer 511 is made of a charged piezoelectric material, electrically connecting to a microprocessor, and would deform upon receiving a driving signal from the microprocessor. A receiving space 514 is maintained between the valve conductive layer 511 and the valve substrate layer 512. The flexible membrane 513 is made of a flexible material, and the flexible membrane 513 is attached on a side of the valve conductive layer 511 and is placed in the receiving space 514. A plurality of holes 511a, 512a, 513a is respectively formed on the valve conductive layer 511, the valve substrate layer 512, and the flexible membrane 513. The holes 511a of the valve conductive layer 511 and the holes 513a of the flexible membrane 513 are aligned with each other, and the holes 512a of the valve substrate layer 512 and the holes 511a of the valve conductive layer 511 are not aligned with each other. Therefore, as shown in FIG. 4A, when the valve conductive layer 511 does not receive the driving signal from the microprocessor, the valve conductive layer 511 is retained in the receiving space 514 and spaces apart from the valve substrate layer 512, thereby allowing the valve unit 51 to be in an opened state, since the holes 512a of the valve substrate layer 512 and the holes 511a of the valve conductive layer 511 are aligned with each other. As shown in FIG. 4B, when the valve conductive layer 511 receives the driving signal of the microprocessor, the valve conductive layer 511 is deformed and moved close to and attach to the valve substrate layer 512, so that the flexible membrane 513 covers the holes 512a of the valve substrate layer 512, thereby allowing the valve unit 51 to be in a closed state since the holes 513a of the flexible membrane 513 and the holes 512a of the valve substrate layer 512 are aligned with each other.

Figure 5A:
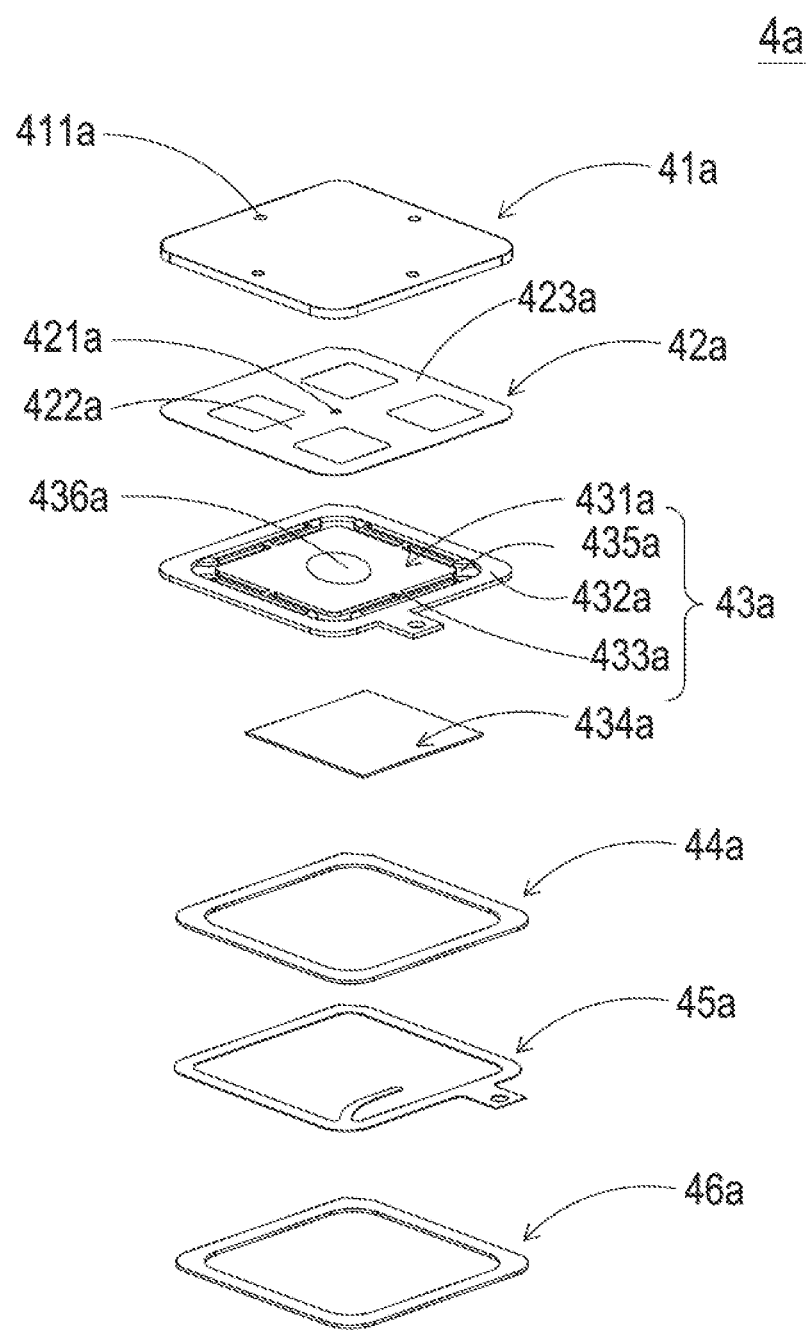
FIG. 5A illustrates an exploded view of a micro pump of the earphone according to an exemplary embodiment of the present disclosure.
Figure 5B:
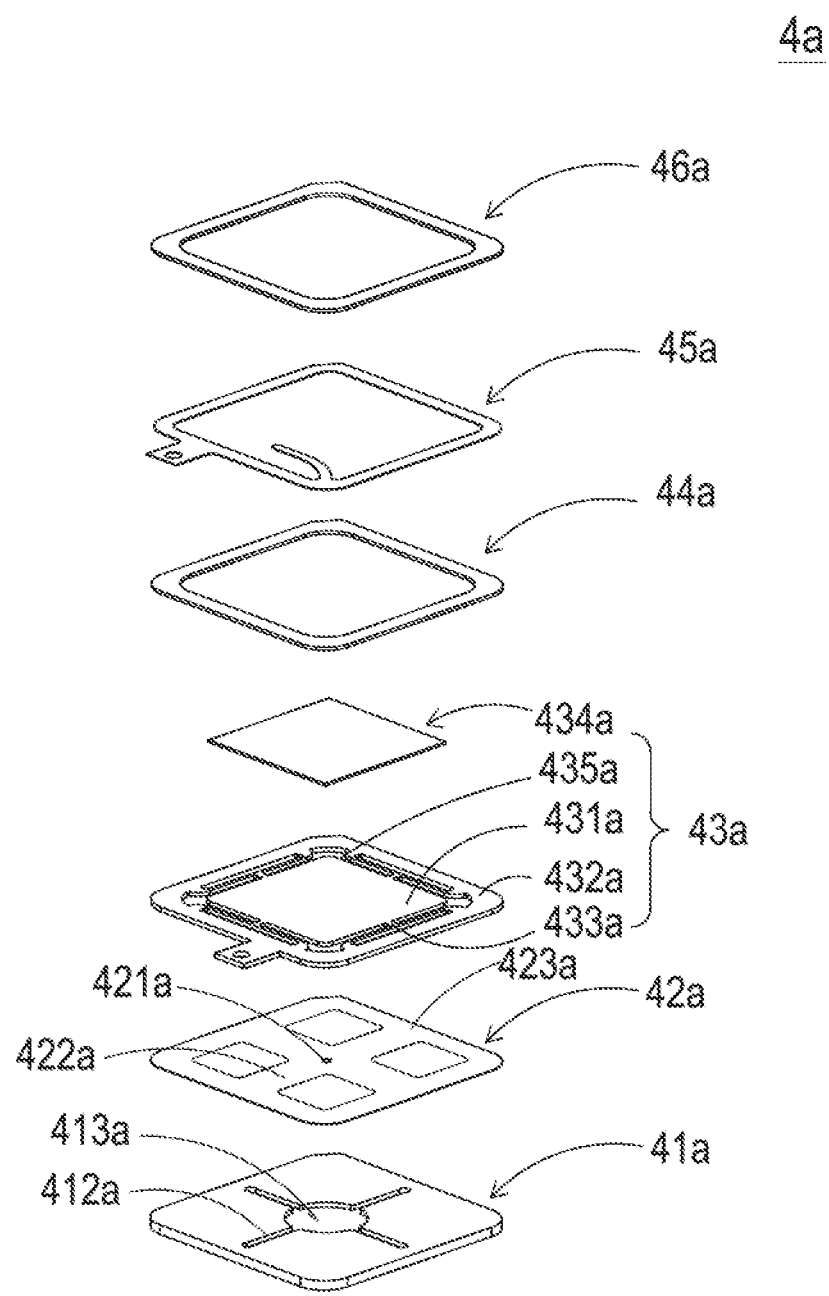
FIG. 5B illustrates an exploded view of the micro pump of the earphone according to the exemplary embodiment of the present disclosure, from another perspective.

Further, please refer to FIG. 5A and FIG. 5B. The gas actuator may be a micro pump. The micro pump 4a is sequentially stacked by an inlet plate 41a, a resonance sheet 42a, a piezoelectric actuator 43a, a first insulation sheet 44a, a conductive sheet 45a, and a second insulation sheet 46a. The inlet plate 41a has at least one inlet hole 411a, at least one convergence channel 412a, and a convergence chamber 413a. The inlet hole 411a is used to introduce the gas outside the micro pump 4a to flow into the micro pump 4a. The inlet hole 411a correspondingly penetrates the convergence channel 412a, and the convergence channel 412a is converged at the convergence chamber 413a, so that the gas introduced from the inlet hole 411a can be converged at the convergence chamber 413a. In this embodiment, the number of the inlet holes 411a and the number of the convergence channels 412a are the same. Moreover, in this embodiment, the number of the inlet holes 411a and the number of the convergence channels 412a both are four, respectively, but not limited thereto. The four inlet holes 411a respectively penetrate the four convergence channels 412a, and the four convergence channels 412a are converged into the convergence chamber 413a.

Figure 6A:
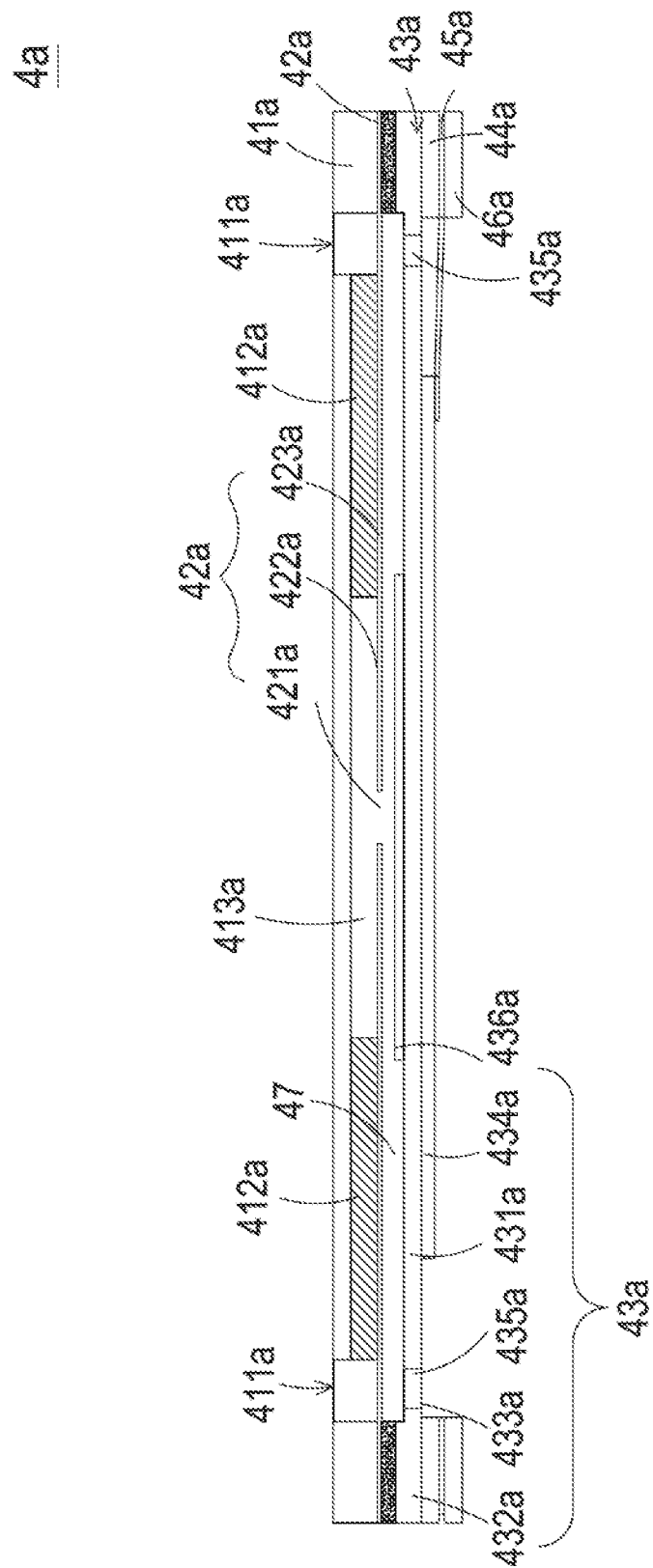
FIG. 6A illustrates a cross-sectional view of the micro pump of the earphone according to the exemplary embodiment of the present disclosure.

Please refer to FIG. 5A, FIG. 5B, and FIG. 6A. The resonance sheet 42a may be assembled on the inlet plate 41a by attaching. Furthermore, the resonance sheet 42a has a perforation 421a, a movable portion 422a, and a fixed portion 423a. The perforation 421a is located at a center portion of the resonance sheet 42a and corresponds to the convergence chamber 413a of the inlet plate 41a. The movable portion 422a is disposed at a periphery of the perforation 421a and is disposed at a portion corresponding to the convergence chamber 413a. The fixed portion 423a is disposed at an outer periphery of the resonance sheet 42a and attached to the inlet plate 41a.

Please still refer to FIG. 5A, FIG. 5B, and FIG. 6A. The piezoelectric actuator 43a includes a suspension plate 431a, an outer frame 432a, at least one supporting element 433a, a piezoelectric element 434a, at least one gap 435a, and a protruding portion 436a. In the embodiments of the present disclosure, the suspension plate 431a is in square shape. It is understood that, the reason why the suspension plate 431a adopts the square shape is that, comparing with a circle suspension plate having a diameter equal to the side length of the square suspension plate 431a, the square suspension plate 431a has an advantage of saving electricity power. The power consumption of a capacitive load operated at a resonance frequency may increase as the resonance frequency increases, and since the resonance frequency of a square suspension plate 431a is much lower than that of a circular suspension plate, the power consumption of the square suspension plate 431a is relatively low as well. Consequently, the square design of the suspension plate 431a used in one or some embodiments of the present disclosure has the benefit of power saving. In the embodiments of the present disclosure, the outer frame 432a is disposed around the periphery of the suspension plate 431a. The at least one supporting element 433a is formed between the suspension plate 431a and the outer frame 432a to provide a flexible support for the suspension plate 431a. In the embodiments of the present disclosure, the piezoelectric element 434a has a side length, which is shorter than or equal to a side length of the suspension plate 431a. The piezoelectric element 434a is attached to a surface of the suspension plate 431a so as to drive the suspension plate 431a to bend and vibrate when the piezoelectric element 434a is applied with a voltage. There is at least one gap 435a formed between the suspension plate 431a, the outer frame 432a, and the at least one supporting element 433a for the gas to flow therethrough. The protruding portion 436a is disposed on a surface of the suspension plate 431a opposite to the surface of the suspension plate 431a where the piezoelectric element 434a is attached. In this embodiment, the protruding portion 436a may be a convex structure protruding out from and integrally formed with the surface of the suspension plate 431a opposite to the surface of the suspension plate 431a where the piezoelectric element 434a is attached by performing an etching process on the suspension plate 431a.

Please still refer to FIG. 5A, FIG. 5B, and FIG. 6A. In this embodiment, the inlet plate 41a, the resonance sheet 42a, the piezoelectric actuator 43a, the first insulation plate 44a, the conductive plate 45a, and the second insulation plate 46a are stacked sequentially with each other, and a chamber space 47 is formed between the suspension plate 431a of the piezoelectric actuator 43a and the resonance sheet 42a. The chamber space 47 can be formed by filling a material, such as conductive adhesive, between the resonance sheet 42a and the outer frame 432a of the piezoelectric actuator 43a, but not limited thereto. Through filling a material, such as conductive adhesive, but not limit thereto, between the resonance sheet 42a and the suspension plate 431a, a certain distance can be maintained between the resonance sheet 42a and the suspension plate 431a to form the chamber space 47 so as to allow the gas to be guided to and flow more quickly. Further, since an appropriate distance is maintained between the suspension plate 431a and the resonance sheet 42a, the interference raised by the contact between the suspension plate 431a and the resonance sheet 42a can be reduced, so that the noise generated thereby can be reduced as well. In other embodiments, the required thickness of filling the conductive adhesive between the resonance sheet 42a and the outer frame 432a of the piezoelectric actuator 43a can be decreased by increasing the height of the outer frame 432a of the piezoelectric actuator 43a. Accordingly, the entire structure of the micro pump 4a would not be indirectly affected as the filling material of conductive adhesive might be influenced by the hot pressing temperature and the cooling temperature, thereby avoiding the situation that the actual spacing of the chamber space 47 is affected by the thermal expansion and contraction of the filling material of the conductive adhesive, but are not limited thereto. Moreover, the height of the chamber space 47 also affects the transmission efficiency of the micro pump 4a. Therefore, it is important to maintain a fixed height of the chamber space 47 for the purpose of achieving stable transmission efficiency of the micro pump 4a.

Figure 6B:
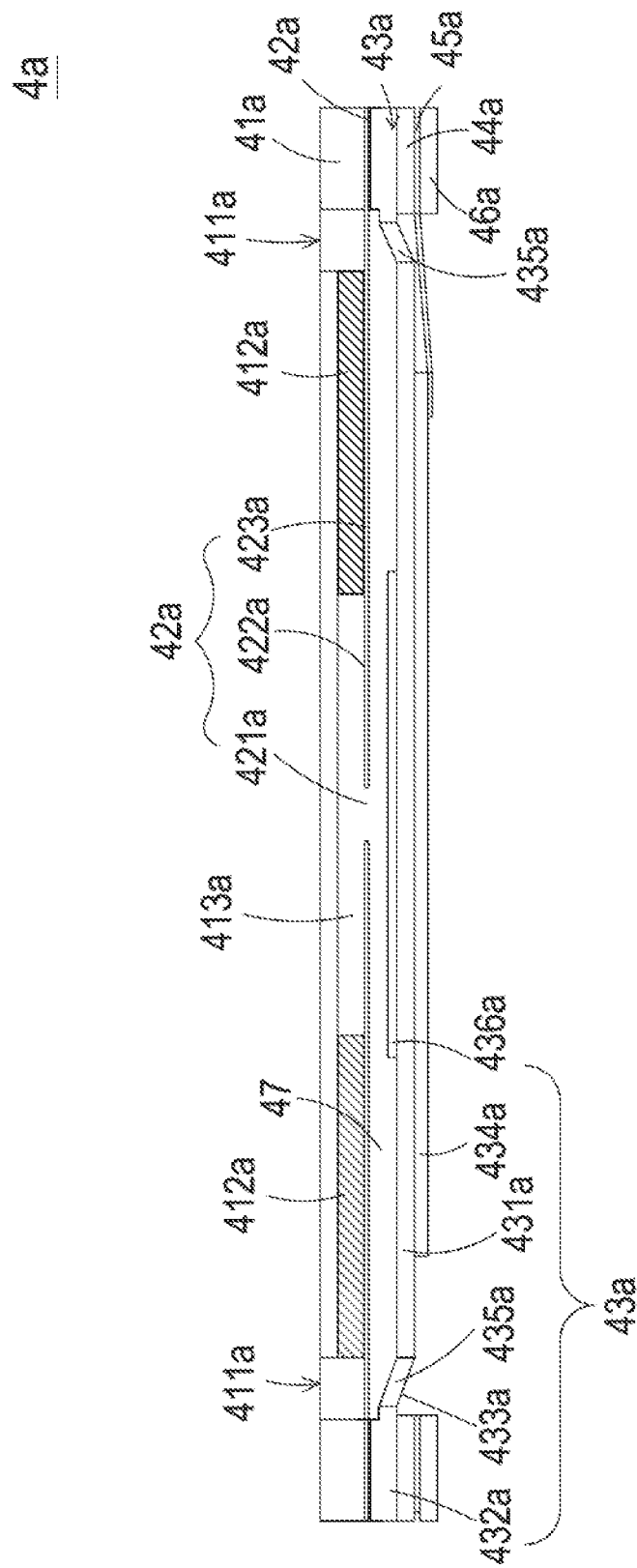
FIG. 6B illustrates a cross-sectional view of the micro pump of the earphone according to another exemplary embodiment of the present disclosure.

Therefore, as shown in FIG. 6B, in other embodiments of the piezoelectric actuator 43a, the suspension plate 431a can be extended out with a certain distance by stamping. The extension distance can be adjusted by at least one supporting element 433a between the suspension plate 431a and the outer frame 432a so as to make the surface of the protruding portion 436a on the suspension plate 431a be not coplanar with the surface of the outer frame 432a. The piezoelectric actuator 43a is assembled to the resonance sheet 42a by attaching the piezoelectric actuator 43a onto the fixed portion 423a of the resonance sheet 42a through hot pressing with applying a few amount of filling material (such as the conductive adhesive) on the assembly surface of the outer frame 432a. In this embodiment, through the above structure improvement of the chamber space 47 obtained by stamping the suspension plate 431a of the piezoelectric actuator 43a and maintaining a chamber space 47 between the surface of the suspension plate 431a and the resonance sheet 42a, the required chamber space 47 can be obtained by directly adjusting the extension distance of the suspension plate 431a of the piezoelectric actuator 43a. This could effectively simplify the structural design of the chamber space 47, and also simplify the manufacturing process and shortens the manufacturing time of the chamber space 47. Moreover, the first insulation sheet 44a, the conductive sheet 45a, and the second insulation sheet 46a are all thin sheets with a frame like structure and are sequentially stacked and assembled on the piezoelectric actuator 43a to form the main structure of the micro pump 4a.

Figure 6C:
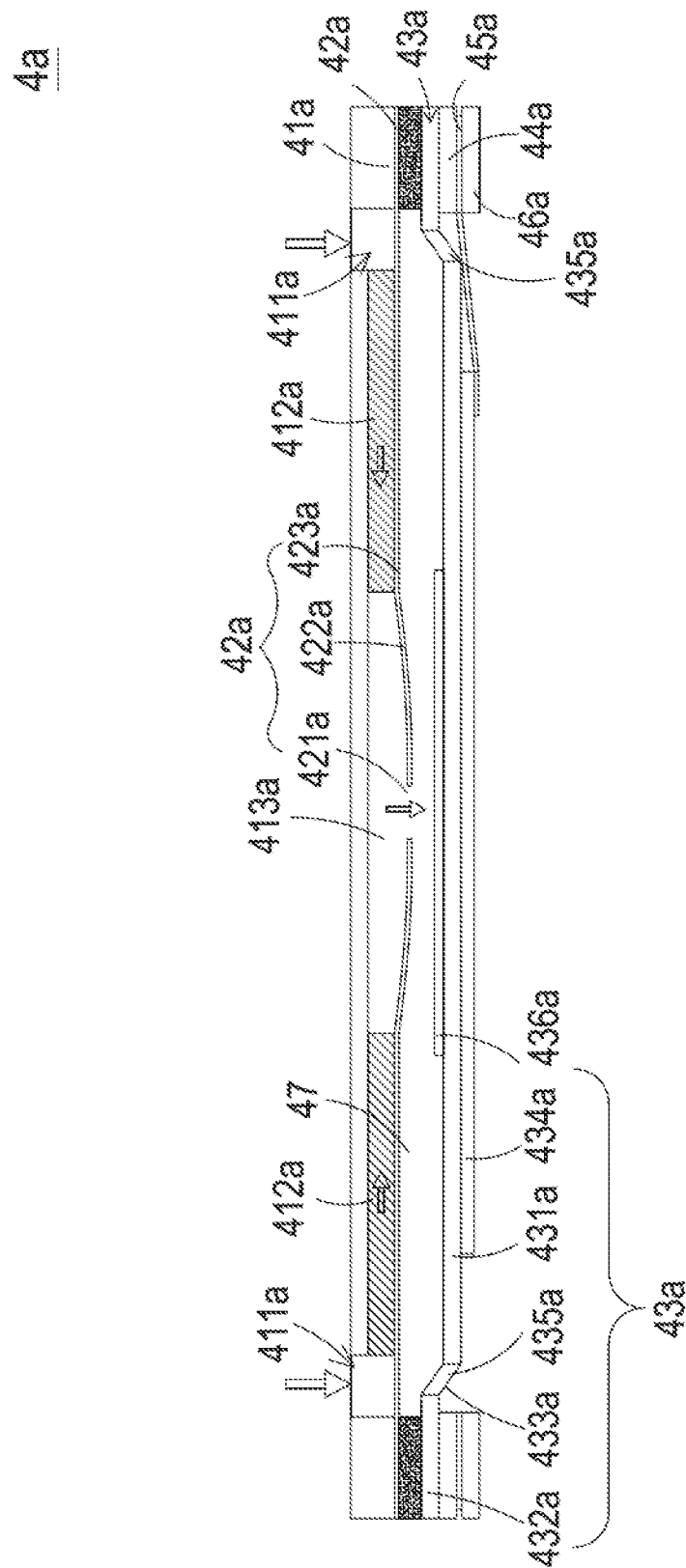
FIG. 6C to FIG. 6E illustrate schematic cross-sectional views showing the micro pump shown in FIG. 6A at different operation steps.
Figure 6D:
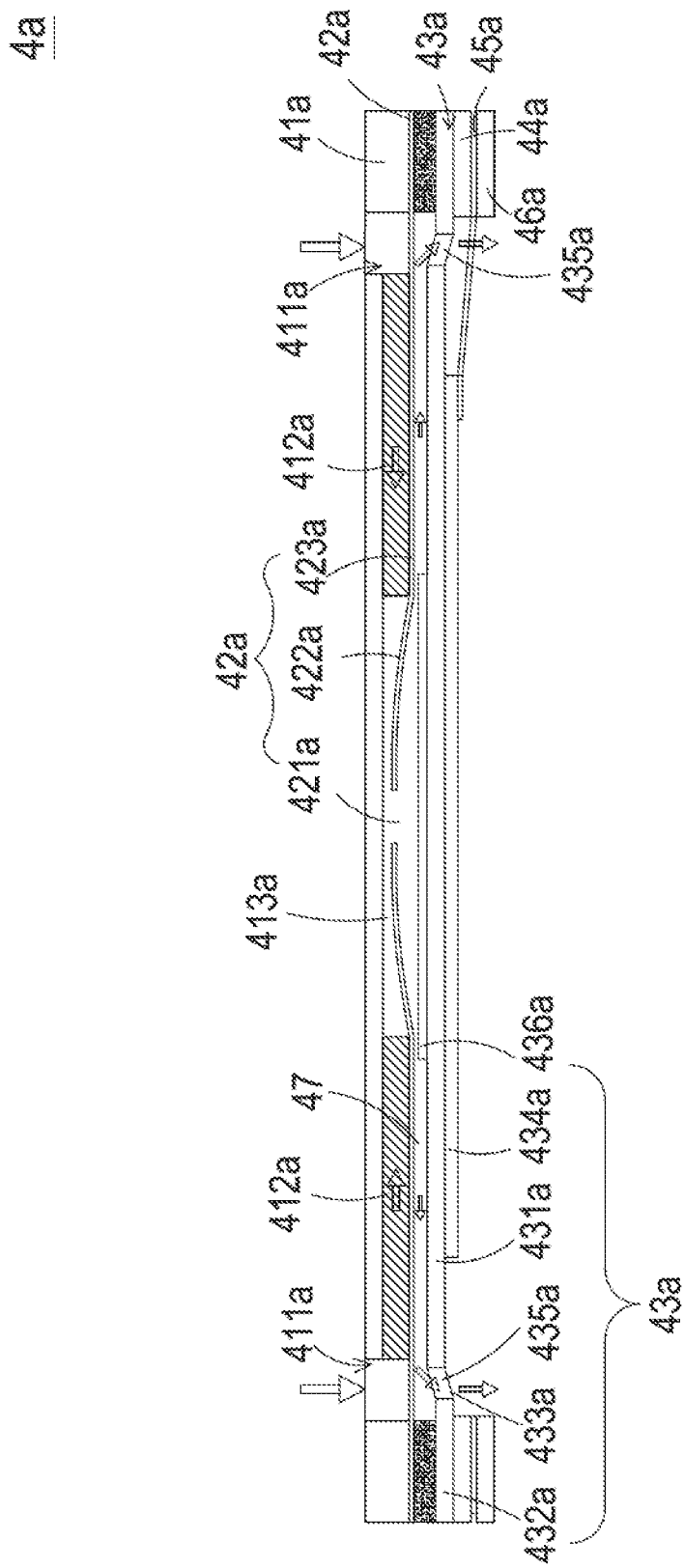
Figure 6E:
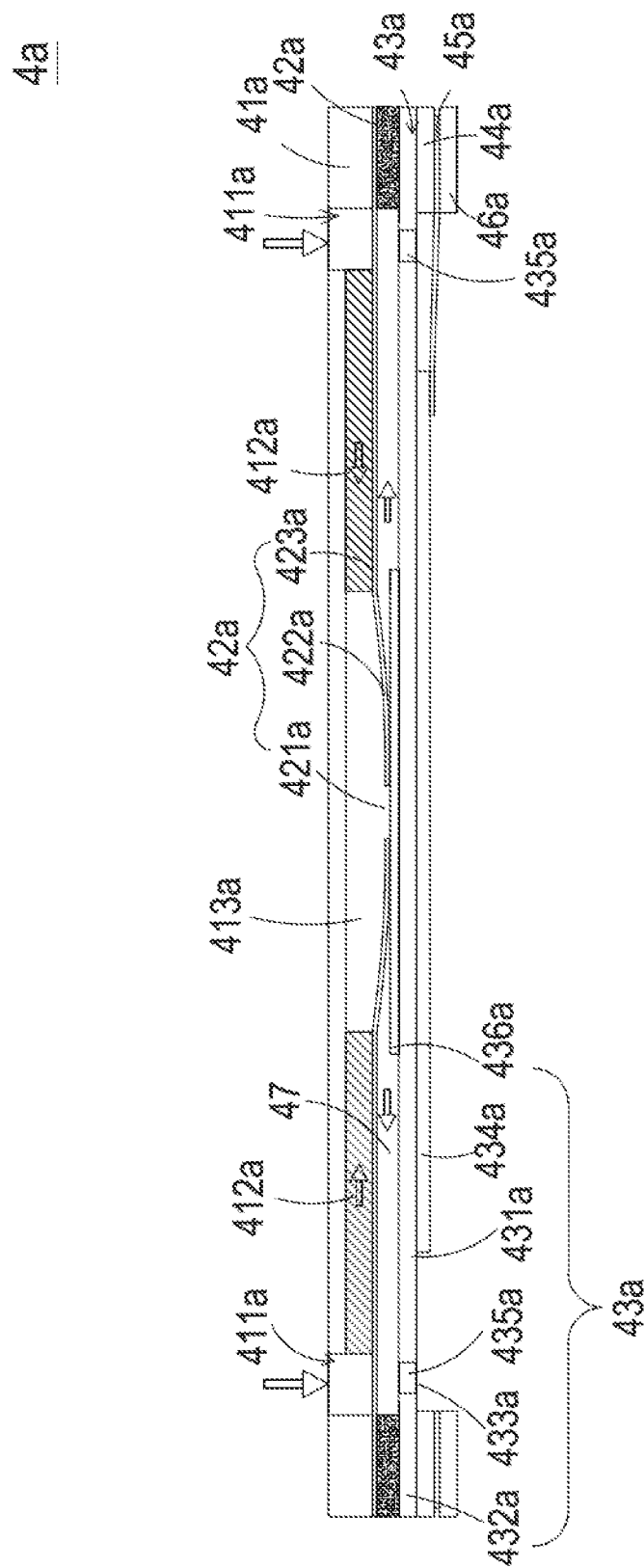
Figure 7:
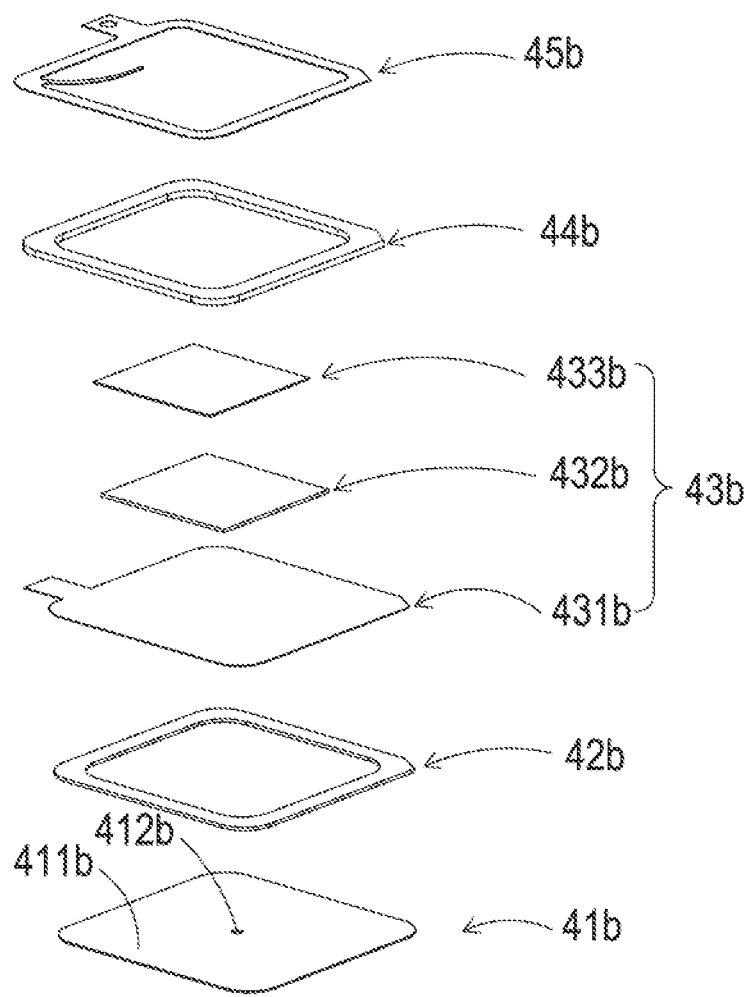
FIG. 7 illustrates an exploded view of a blower-type micro pump of the earphone according to an exemplary embodiment of the present disclosure.

In order to understand the operation steps of the aforementioned micro pump 4a in gas transmitting procedure, please refer to FIG. 6C to FIG. 6E. Please refer to FIG. 6C first, the piezoelectric element 434a of the piezoelectric actuator 43a deforms after being applied with a driving voltage, and the piezoelectric element 434a drives the suspension plate 431a to move downwardly and to move away from the inlet plate 431a. Thus, the volume of the chamber space 47 is increased and a negative pressure is generated inside the chamber space 47, thereby drawing the gas into the convergence chamber 413a and enter into the chamber space 47. At the same time, owing to the resonance effect, the resonance sheet 42a moves downwardly and moves away from the inlet plate 41a correspondingly, and increases the volume of the convergence chamber 413a. Furthermore, since the gas inside the convergence chamber 413a is drawn into the chamber space 47, the convergence chamber 413a is in a negative pressure state as well, and the gas can be drawn into the convergence chamber 413a through the inlet hole 411a and the convergence channel 412a and then pass through the perforation 421a of the resonance sheet 42a into the chamber space 47. Then, please refer to FIG. 6D. The piezoelectric element 434a drives the suspension plate 431a to move upwardly to move toward the inlet plate 41a, and compresses the chamber space 47. Similarly, since the movable portion 422a of the resonance sheet 42a resonates with the suspension plate 431a, the resonance sheet 42a also moves upwardly and moves toward the inlet plate 41a, thereby pushing the gas in the chamber space 47 to move downwardly and transmit out of the micro pump 4a through the at least one gap 435a so as to achieve gas transmission. Last, please refer to FIG. 6E. When the suspension plate 431a moves resiliently to its original position, the resonance sheet 42a still moves downwardly and moves away from the inlet plate 431 due to its inertia momentum. At this time, the resonance sheet 42a compresses the chamber space 47, so that the gas in the chamber space 47 is moved toward the gap 435a and the volume of the convergence chamber 413a is increased. Accordingly, the gas can be drawn into the convergence chamber 413a continuously through the inlet holes 411a and the convergence channels 412a and can be converged at the convergence chamber 413a. Through continuously repeating the operation steps of the micro pump 4a shown in FIG. 6C to FIG. 6E, the micro pump 4a can make the gas continuously enter into the flow paths formed by the inlet plate 41a and the resonance sheet 42a from the inlet holes 411a, thereby generating a pressure gradient. The gas is then transmitted outward through the gap 435a. As a result, the gas can flow at a relatively high speed, thereby achieving the effect of gas transmission of the micro pump 4a.

As noted above, the valve component 5 covered on the gas actuator 4 has a valve unit 51 at a position corresponding to the inlet holes 411a of the micro pump 4a. When the gas actuator 4 and the valve component 5 are driven, the valve unit 51 is opened to control the gas introduction of the gas actuator 4, and the gas actuator 4 is actuated to transmit the gas to the ventilating channel 13 for gas collection, and the gas actuator 4 further transmits the gas to the gas bag 3 for inflating the gas bag 3, so that the gas bag 3 is expanded and protruded out of the wearing surface 11 of the earphone body 1 (as shown in FIG. 2B). Therefore, the earphone can be stably worn and attached to the user's ear portion. Alternatively, in another embodiment, as shown in FIG. 3A, the gas bag 3 is disposed in an attaching foam component 15 of a hanging-on type earphone. When gas bag 3 is inflated, the gas bag 3 is expanded and attached to the inner portion of the attaching foam component 15, so as to allow the attaching foam component 15 to provide a better support function, so that the earphone can be stably worn and attached to the user's ear portion.

Please refer to FIG. 7 and FIG. 8A to FIG. 8C. The gas actuator 4 may be a blower type micro pump 4b. The blower type micro pump 4b is loaded on positioning bumps 141 of a gas-guiding loading region 14 of the base member 12, and a bottom portion of the blower type micro pump 4b is in communication with the ventilating channel 13. The blower type micro pump 4b includes a nozzle plate 41b, a chamber frame 42b, an actuation body 43b, an insulation frame 44b, and a conductive frame 45b. The nozzle plate 41b is made of a flexible material and has a suspension sheet 411b and a hollow hole 412b. The suspension sheet 411b is a flexible sheet, which can bend and vibrate. The shape and the size of the suspension sheet 411b approximately correspond to those of the inner edge of the gas-guiding loading region 14, but not limited thereto. The shape of the suspension sheet 411b may be one of square, circle, ellipse, triangle, and polygon. The hollow hole 412b penetrates the center portion of the suspension sheet 411b for allowing the gas to flow therethrough.

The chamber frame 42b is stacked on the nozzle plate 41b, and the shape of the chamber frame 42b corresponds to the shape of the nozzle plate 41b. The actuation body 43b is stacked on the chamber frame 42b, and a resonance chamber 46b is formed between the chamber frame 42b, the actuation body 43b, and the suspension sheet 411b. The insulation frame 42b is stacked on the actuation body 43b. The appearance of the insulation frame 44b is similar to the appearance of the chamber frame 42b. Moreover, the actuation body 43b further includes a piezoelectric carrier plate 431b, an adjusting resonance plate 432b, and a piezoelectric plate 433b. The piezoelectric carrier plate 431b is stacked on the chamber frame 42b. The adjusting resonance plate 432b is stacked on the piezoelectric carrier plate 431b. The piezoelectric plate 433b is stacked on the adjusting resonance plate 432b. The adjusting resonance plate 432b and the piezoelectric plate 433b are accommodated in the insulation frame 44b. The conductive frame 45b is electrically connected to the piezoelectric plate 433b. The piezoelectric carrier plate 431b and the adjusting resonance plate 432b are both made of the conductive materials. The piezoelectric carrier plate 431b is electrically connected to a driving circuit (not shown) on the base member 12 so as to receive a driving signal (a driving frequency and a driving voltage). The piezoelectric carrier plate 431b, the adjusting resonance plate 432b, the piezoelectric plate 433b, and the conductive frame 45b may together form a circuit for transmitting the driving signal, and the insulation frame 44b is provided for electrically isolating the conductive frame 45b from the actuation body 43b for avoiding short circuit, thereby the driving signal can be transmitted to the piezoelectric plate 433b. When the piezoelectric plate 433b receives the driving signal (a driving frequency and a driving voltage), the piezoelectric plate 433b deforms owing to the piezoelectric effect, and thus the piezoelectric carrier plate 431b and the adjusting resonance plate 432b are driven to perform reciprocating vibration correspondingly.

As mentioned above, the adjusting resonance plate 432b is disposed between the piezoelectric plate 433b and the piezoelectric carrier plate 431b as a cushion element so as to adjust the vibration frequency of the piezoelectric carrier plate 431b. Generally, the thickness of the adjusting resonance plate 432b is greater than the thickness of the piezoelectric carrier plate 431b. The thickness of the adjusting resonance plate 432b may be changed to adjust the vibration frequency of the actuation body 43b.

Figure 8A:
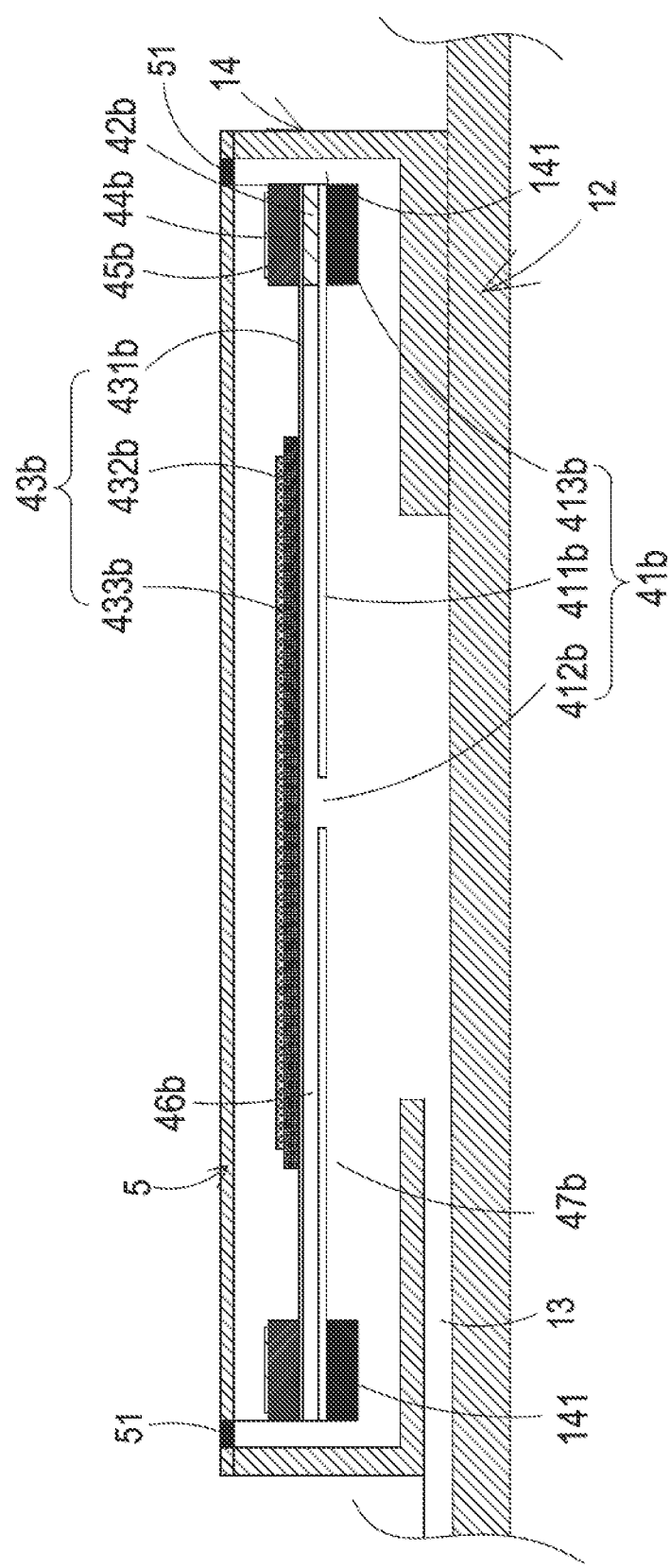
FIG. 8A illustrates a cross-sectional view of the blower-type micro pump of the earphone according to the exemplary embodiment of the present disclosure.
Figure 8B:
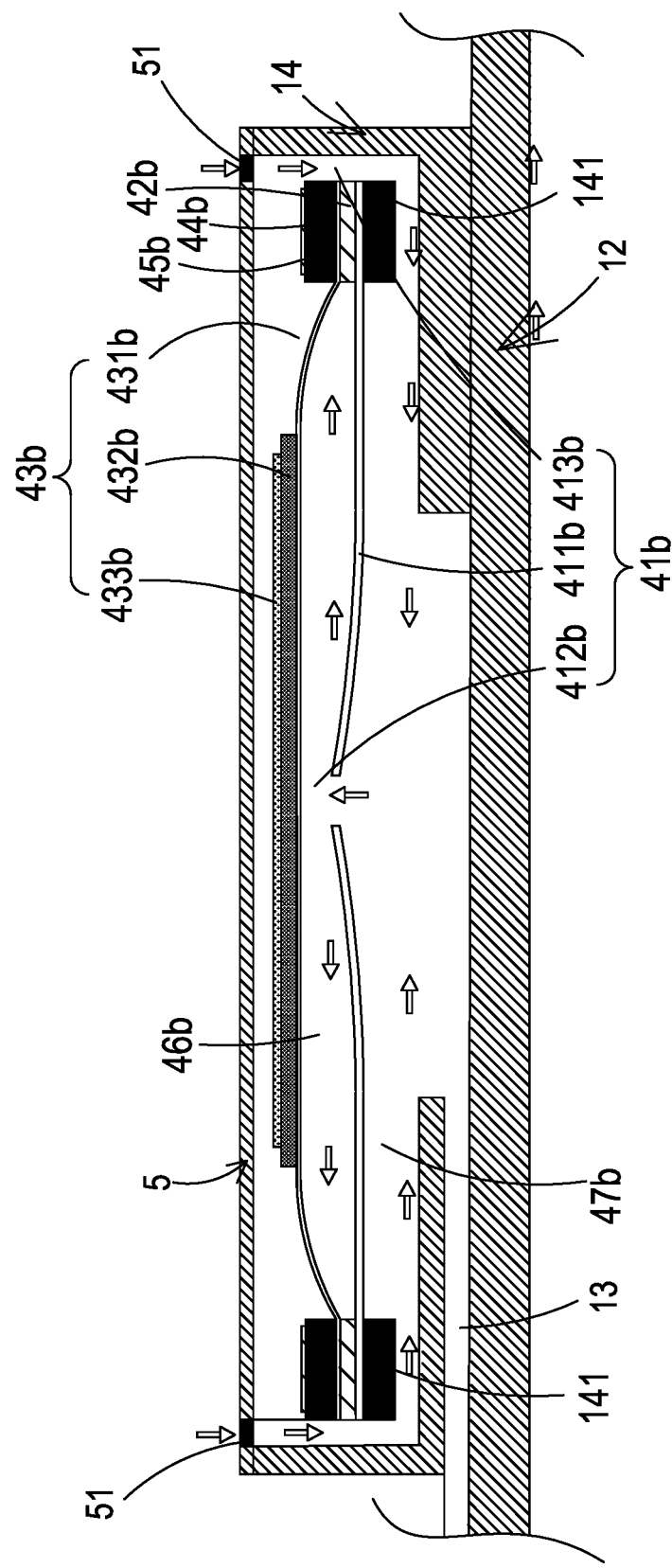
FIG. 8B and FIG. 8C illustrate schematic cross-sectional views showing the blower-type micro pump shown in FIG. 8A at different operation steps.
Figure 8C:
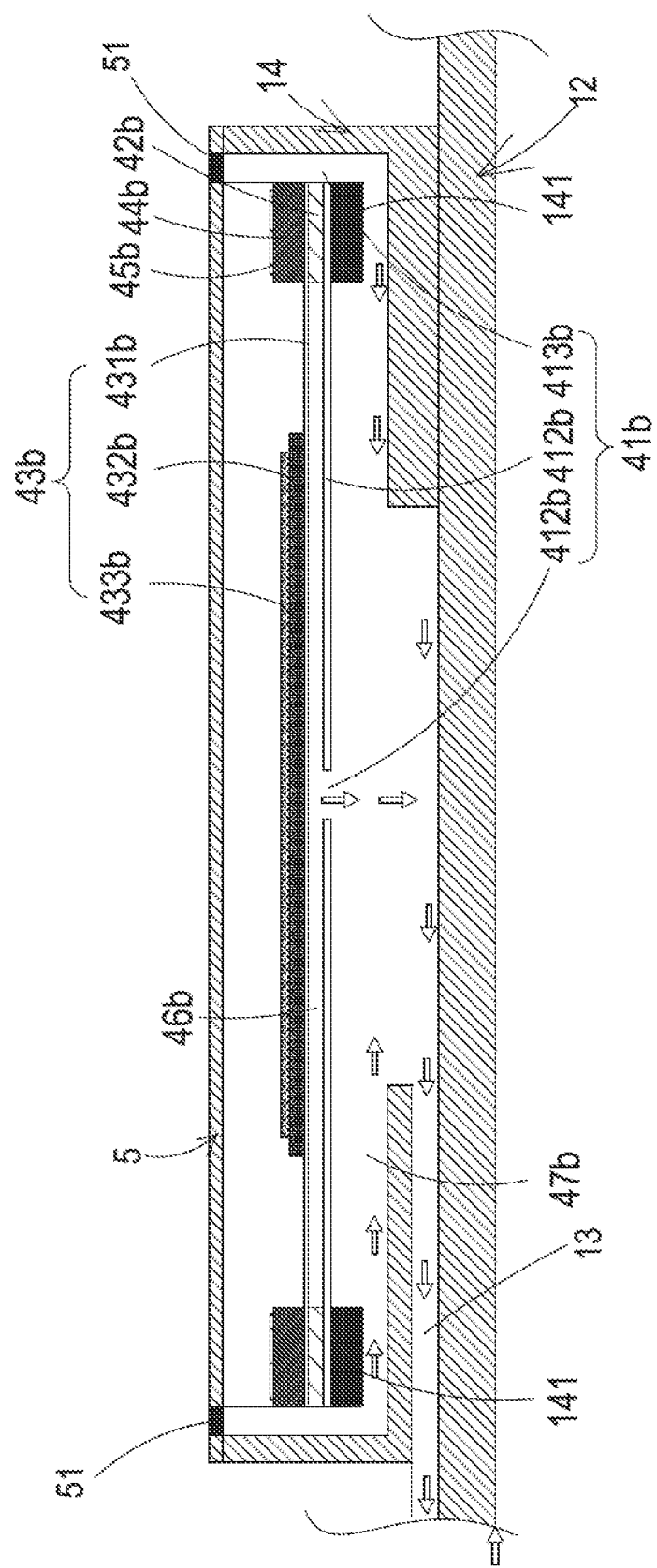
Figure 9A:
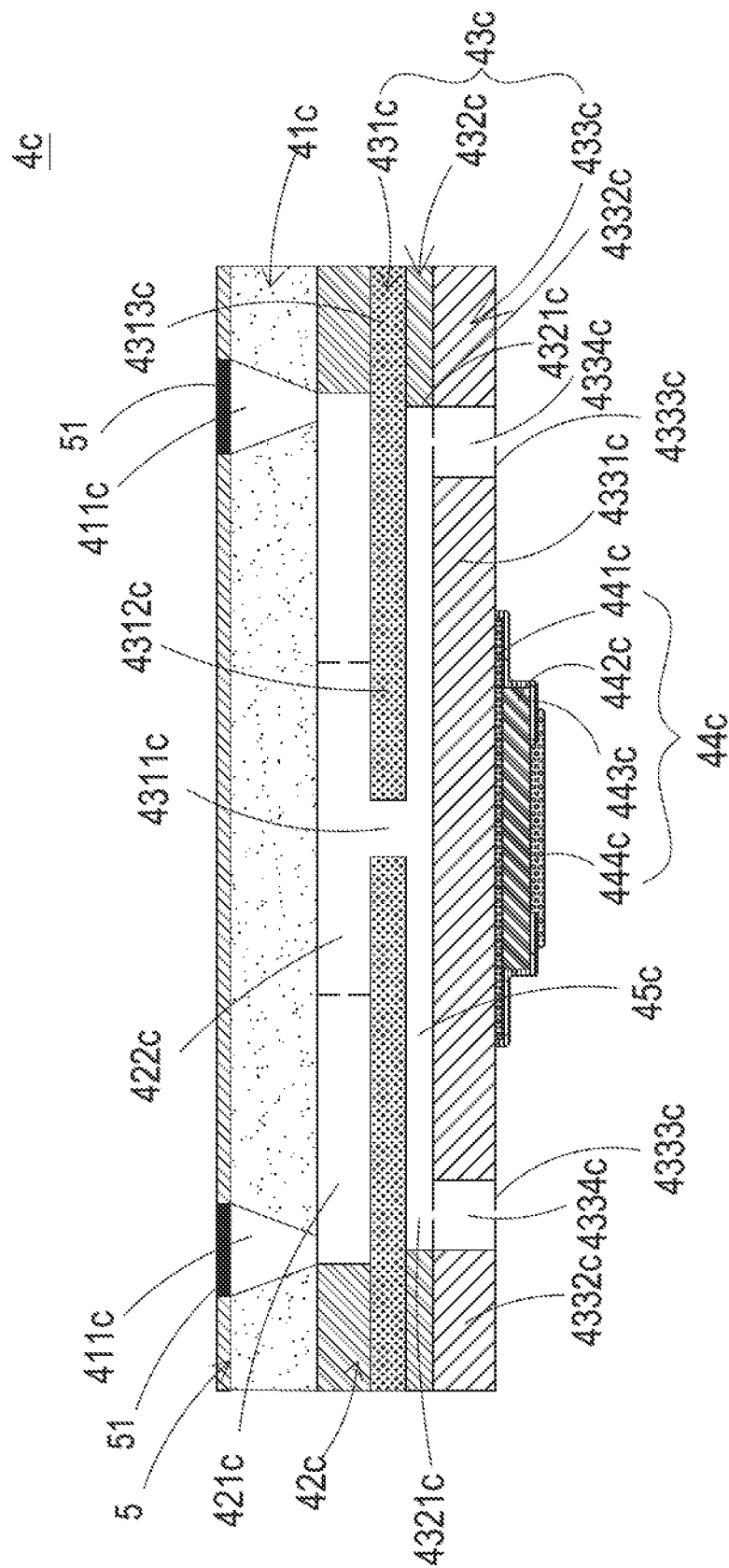
FIG. 9A illustrates a cross-sectional view of a microelectromechanical systems (MEMS) micro pump of the earphone according to an exemplary embodiment of the present disclosure.
Figure 9B:
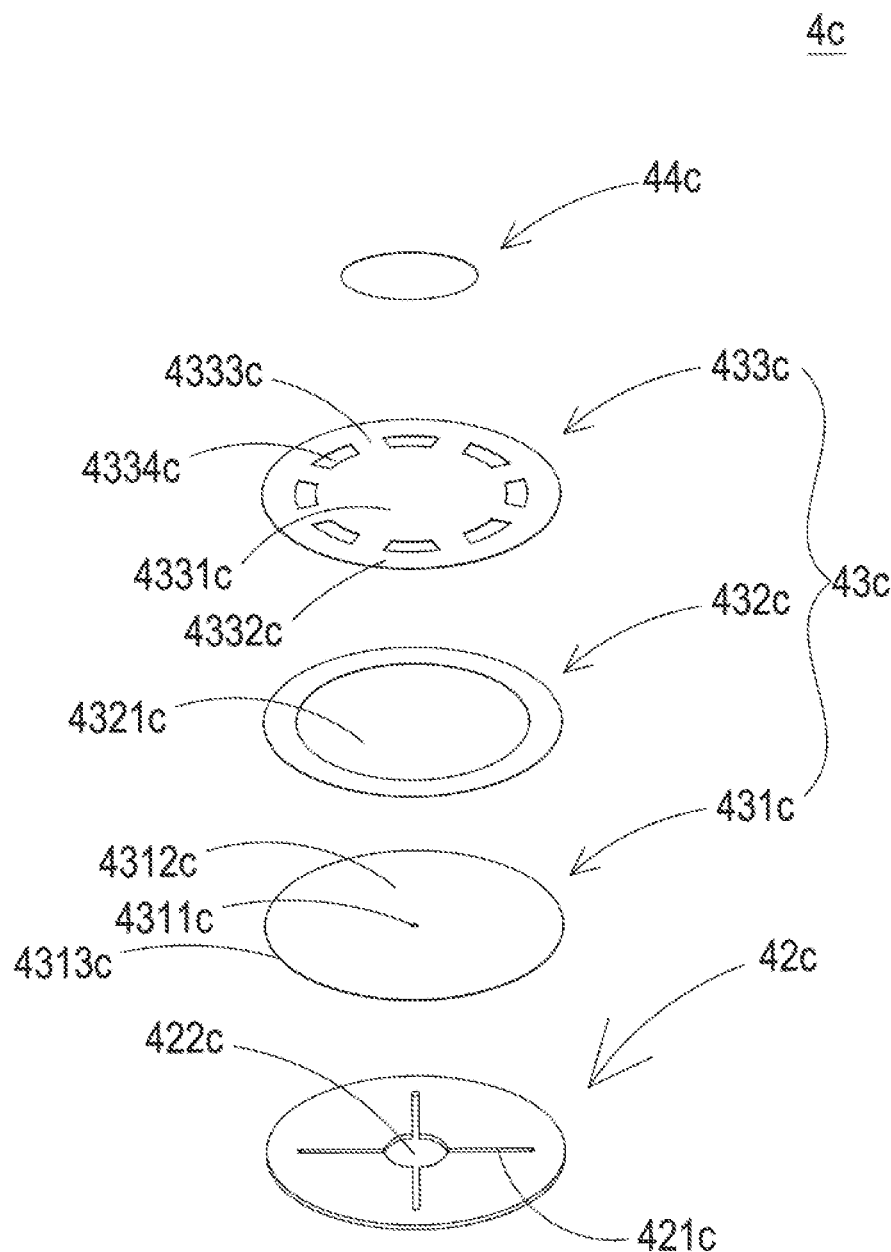
FIG. 9B illustrates an exploded view of the MEMS micro pump of earphone according to the exemplary embodiment of the present disclosure.

Please refer to FIG. 8A, FIG. 8B, and FIG. 8C. The nozzle plate 41b, the chamber frame 42b, the actuation body 43b, the insulation frame 44b, and the conductive frame 45b are sequentially stacked and assembled with each other and are disposed in the gas-guiding loading region 14, so that the blower type micro pump 4b is placed and positioned in the gas-guiding loading region 14. The bottom of the blower type micro pump 4b is supported and positioned by the positioning bumps 141, so that a surrounding gap 413b is defined between the suspension sheet 411b of the blower type micro pump 4b and the inner edge of the gas-guiding loading region 14 for gas to pass therethrough.

Please refer to FIG. 8A first. A gas flow chamber 47b is formed between a bottom of the nozzle plate 41b and the bottom surface of the gas-guiding loading region 14. The gas flow chamber 47b is in communication with, through the hollow hole 412b of the nozzle plate 41b, the resonance chamber 46b formed between the actuation body 43b, the chamber frame 42b, and the suspension sheet 411b. Through controlling the vibration frequency of the gas in the resonance chamber 46b and making the vibration frequency of the gas in the resonance chamber 46b nearly the same with the vibration frequency of the suspension sheet 411b, the resonance chamber 46b and the suspension sheet 411b can generate the Helmholtz resonance effect so as to improve the transmission efficiency of the gas.

Please refer to FIG. 8B. When the piezoelectric plate 433b moves in a direction away from the bottom surface of the gas-guiding loading region 14, the piezoelectric plate 433 drives the suspension sheet 411b of the nozzle plate 41b to move in the direction away from the bottom surface of the gas-guiding loading region 14 correspondingly. Hence, the volume of the gas flow chamber 47b expands dramatically, so that the internal pressure of the gas flow chamber 47b decreases and creates a negative pressure, thereby drawing the gas outside the blower type micro pump 4b to flow into the blower type micro pump 4b through the surrounding gap 413b and enter into the resonance chamber 46b through the hollow hole 412b, thereby increasing the gas pressure of the resonance chamber 46b and thus generating a pressure gradient. Further, as shown in FIG. 8C, when the piezoelectric plate 433b drives the suspension sheet 411b of the nozzle plate 41b to move toward the bottom surface of the gas-guiding loading region 14, the gas inside the resonance chamber 46b is pushed to flow out quickly through the hollow hole 412b so as to further push the gas inside the gas flow chamber 47b, thereby the converged gas can be quickly and massively ejected out of the bottom surface of the gas-guiding loading region 14 and guided into the ventilating channel 13 in a state closing to an ideal gas state under the Benulli's law. Therefore, through repeating the steps as shown in FIG. 8B and FIG. 8C, the piezoelectric plate 433b can bend and vibrate reciprocatingly. Further, after the gas is discharged out of the resonance chamber 46b, the internal pressure of the resonance chamber 46b is lower than the equilibrium pressure due to the inertia, as a result, the pressure difference guides the gas outside the resonance chamber 46b into the resonance chamber 46b again. Thus, through controlling the vibration frequency of the gas inside the resonance chamber 46b to be close the vibration frequency of the piezoelectric plate 433b and generate the Helmholtz resonance effect, high-speed and large-volume gas transmission can be achieved.

As above, the valve component 5 is covered on the gas actuator 4, and the valve unit 51 is correspondingly disposed on the surrounding gap 413b of the blower type micro pump 4b, so that when the gas actuator 4 and the valve component 5 are driven, the valve unit 51 is opened to control the gas introduction of the gas actuator 4, and the gas actuator 4 is actuated to transmit the gas to the ventilating channel 13 for gas collection, and the gas actuator 4 further transmits the gas to the gas bag 3 for inflating the gas bag 3, so that the gas bag 3 is expanded and protruded out of the wearing surface 11 of the earphone body 1 (as shown in FIG. 2B). Therefore, the earphone can be stably worn and attached to the user's ear portion. Alternatively, in another embodiment, as shown in FIG. 3A, the gas bag 3 is disposed in an attaching foam component 15 of a hanging-on type earphone. When gas bag 3 is inflated, the gas bag 3 is expanded and attached to the inner portion of the attaching foam component 15. Hence, the attaching foam component 15 can provide a better support function, so that the earphone can be stably worn and attached to the user's ear portion.

Please refer to FIG. 9A, FIG. 9B, and FIG. 10A to FIG. 10C. The gas actuator 4 may be a microelectromechanical systems (MEMS) micro pump 4c. The MEMS micro pump 4c has a reduced size through surface micromachining techniques. The MEMS micro pump 4c includes a substrate 41c, an oxide layer 42c, a vibration layer 43c, and a piezoelectric component 44c. The substrate 41c is a silicon substrate and formed with at least one inlet 411c by etching.

The oxide layer 42c is formed and stacked on the substrate 41c by deposition, and the oxide layer 42c is formed with a plurality of convergence troughs 421c and a convergence chamber 422c by etching. The convergence channels 421c are in communication between the at least one inlet 411c of the substrate 41c and the convergence chamber 422c. The deposition process may be a physical vapor deposition (PVD) process, a chemical vapor deposition (CVD) process, or a combination thereof, but are not limited thereto. The detailed descriptions about the deposition process are omitted.

The vibration layer 43c formed and stacked on the oxide layer 42c by deposition includes a metal layer 431c, a second oxide layer 432c, and a silicon wafer layer 433c. The metal layer 431c is formed and stacked on the oxide layer 42c by deposition and formed with a through hole 4311c, a vibration portion 4312c, and a fixed portion 4313c by etching. The etching process may be a wet etching process, a dry etching process, or a combination thereof, but not limited thereto.

The through hole 4311c is formed at a center portion of the metal layer 431c by etching. The vibration portion 4312c is formed on a periphery of the through hole 4311c. The fixed portion 4313c is formed on a periphery of the metal layer 431c.

The second oxide layer 432c is formed and stacked on the metal layer 431c by deposition, and the second oxide layer 432c is formed with an oxide layer hole 4321c by etching.

The silicon wafer layer 433c formed and stacked on the second oxide layer 432c by deposition is formed with an actuation portion 4331c, an outer peripheral portion 4332c, a plurality of connection portions 4333c, and a plurality of fluid channels 4334c by etching. The actuation portion 4331c is formed at a center portion of the silicon wafer layer 433c. The outer peripheral portion 4332c is formed around a periphery of the actuation portion 4331c. The connection portions 4333c are respectively connected between the actuation portion 4331c and the outer peripheral portion 4332c. The fluid channels 4334c are respectively formed between the actuation portion 4331c and the outer peripheral portion 4332c, and the fluid channels 4334c are respectively formed between the connection portions 4333c. Accordingly, a compression chamber 45c is formed by the silicon wafer layer 433c and the oxide layer hole 4321c of the second oxide layer 432c.

The piezoelectric component 44c formed and stacked on the actuation portion 4331c of the silicon wafer layer 433c by deposition includes a lower electrode layer 441c, a piezoelectric layer 442c, an insulation layer 443c, and an upper electrode layer 444c. The lower electrode layer 441c is stacked and formed on the actuation portion 4331c of the silicon wafer layer 433c by deposition, and the piezoelectric layer 442c is stacked and formed on the lower electrode layer 441c by deposition. The insulation layer 443a is formed and stacked on a portion of a surface of the piezoelectric layer 442c and on a portion of a surface of the lower electrode layer 441c by deposition, and the upper electrode layer 444c is stacked on the insulation layer 443c and the remaining portion of the surface of the piezoelectric layer 442c which is not covered by the insulation layer 443c for electrically connected to the piezoelectric layer 442c.

Figure 10A:
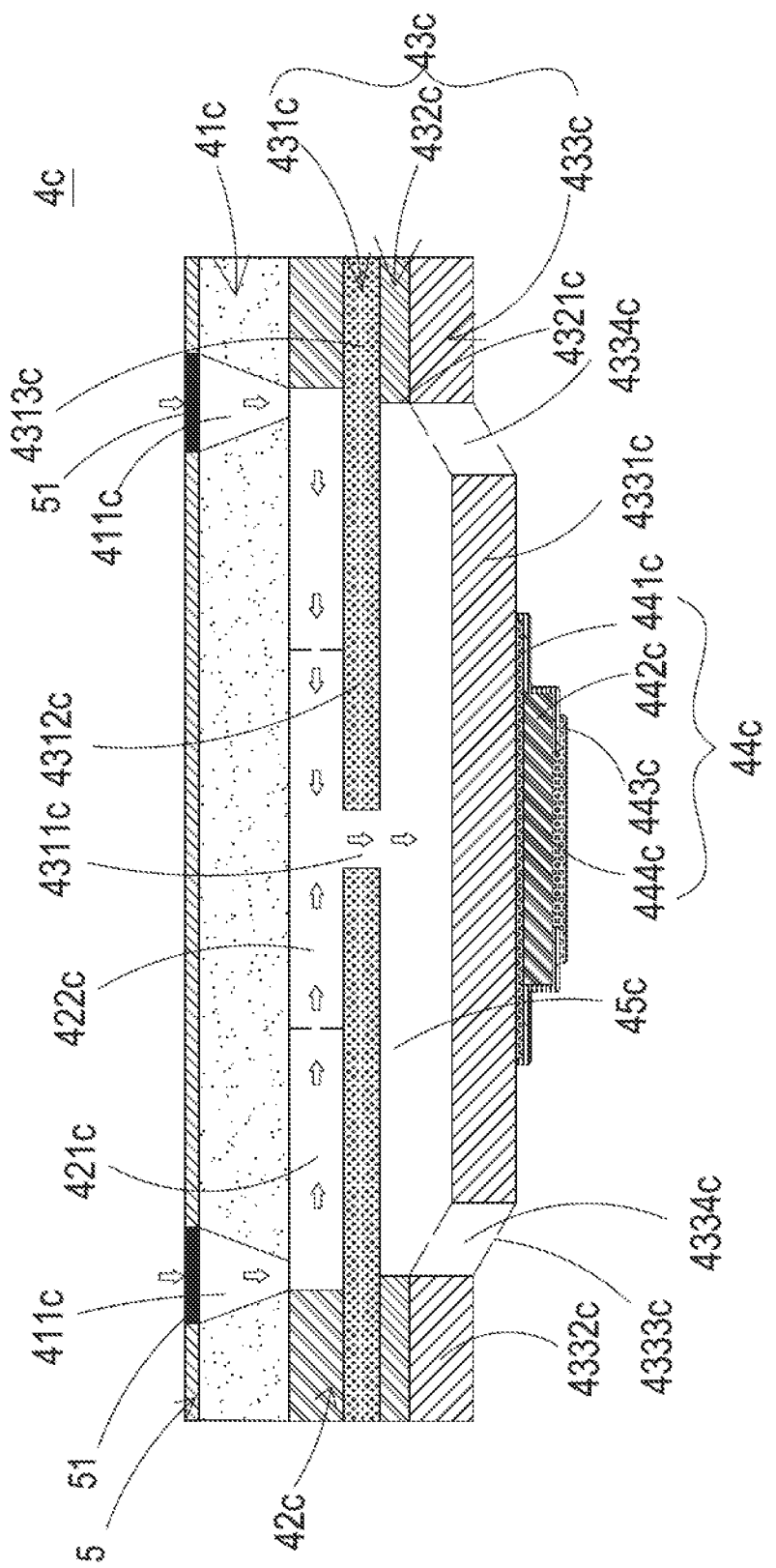
FIG. 10A to FIG. 10C illustrate schematic cross-sectional views showing the MEMS micro pump shown in FIG. 9A at different operation steps.
Figure 10B:
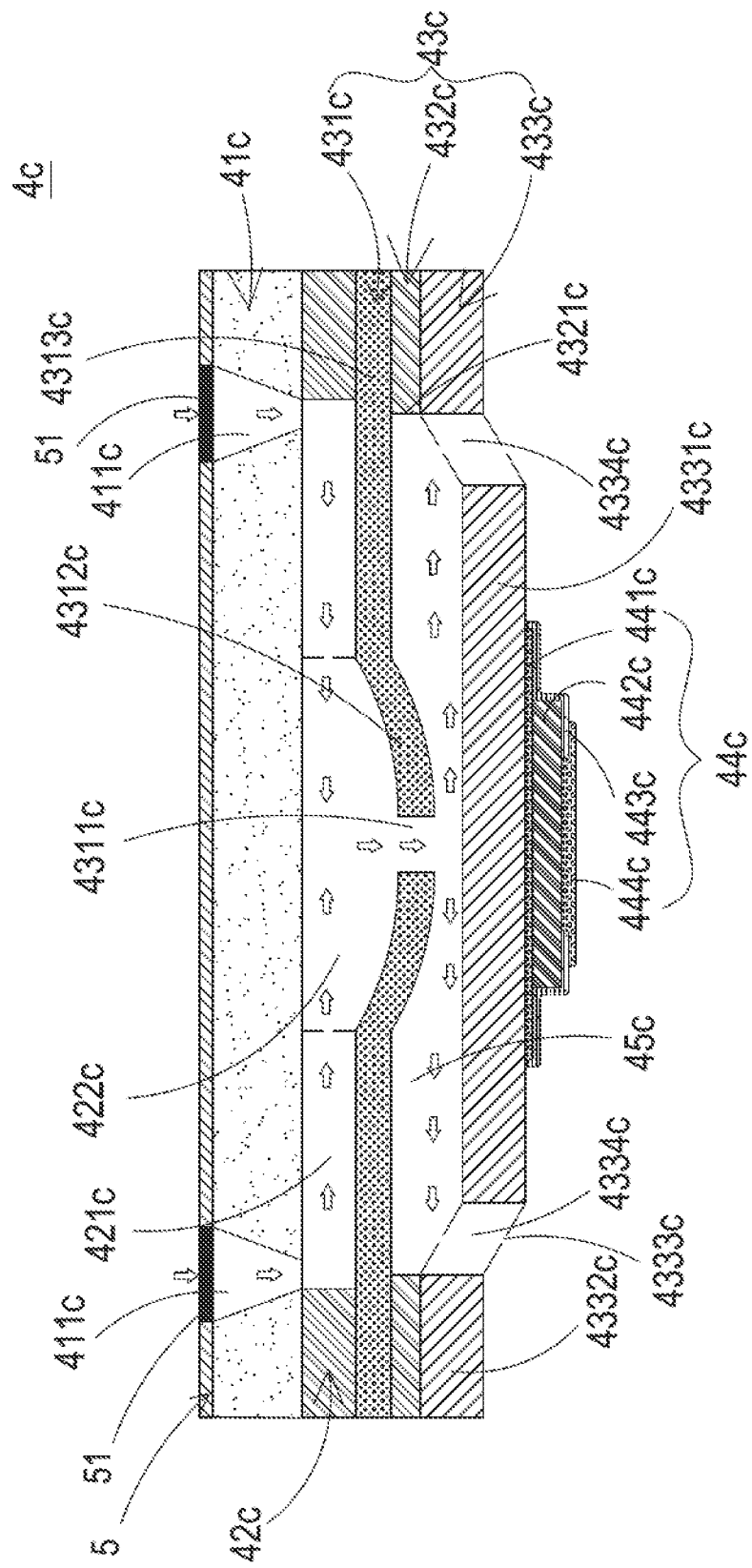
Figure 10C:
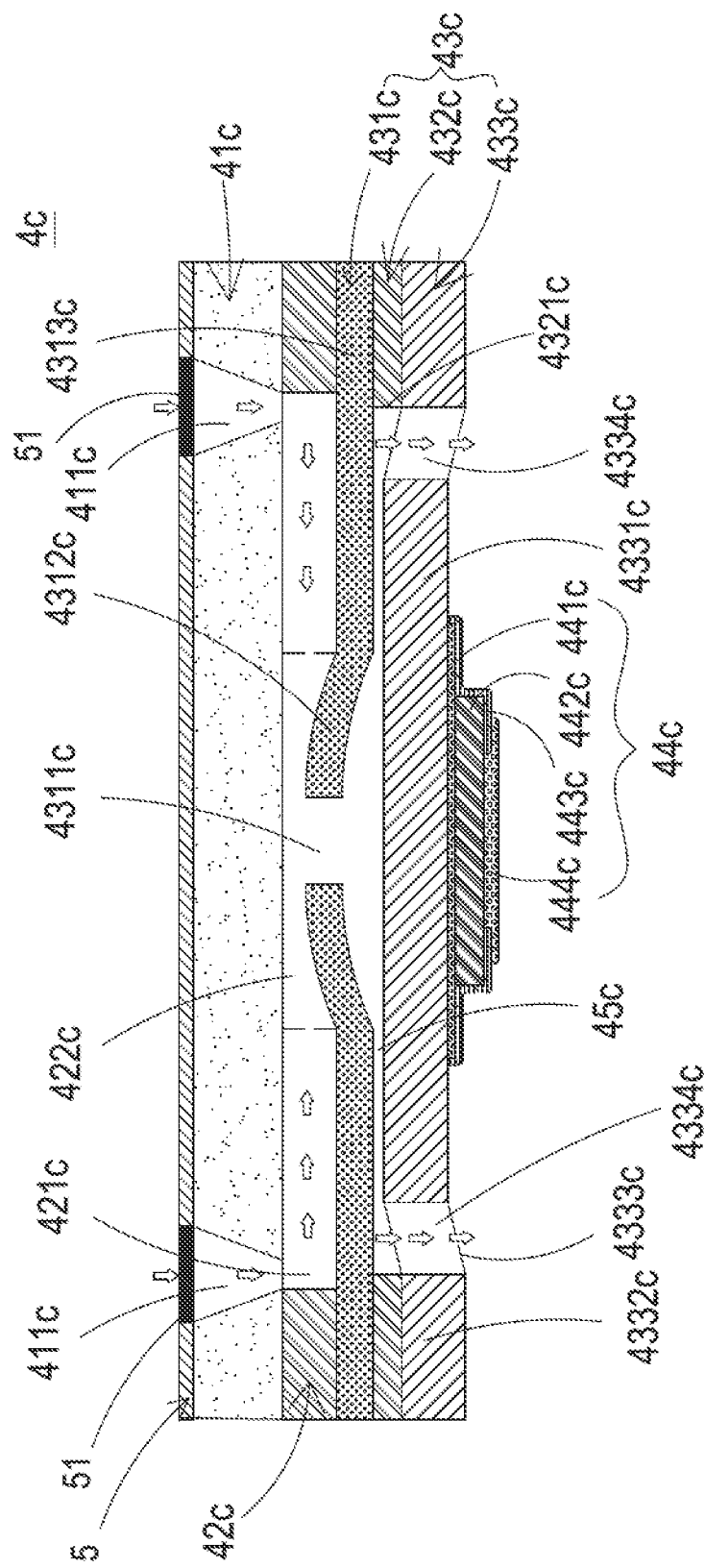

Regarding how the MEMS micro pump 4c performs the gas transmission, please refer to FIG. 10A. When the lower electrode layer 441c and the upper electrode layer 444c of the piezoelectric component 44c receive a driving signal (not shown in the figure), the piezoelectric layer 442c starts to deform because of the reverse piezoelectric effect, thereby driving the actuation portion 4331c of the silicon wafer layer 433c to move correspondingly. When the actuation portion 4331c is driven by the piezoelectric component 44c and thus the distance between the actuation portion 4331c and the second oxide layer 432c increases, the volume of the compression chamber 45c increases as well, and a negative pressure is created in the compression chamber 45c as a result, and thus the gas outside the substrate 41c is drawn into the compression chamber 45c through the inlet 411c, and enters into the convergence troughs 421c and the convergence chamber 422c of the oxide layer 42c. Please refer to FIG. 10B, when the actuation portion 4331c is driven upwardly by the piezoelectric component 44c, the vibration portion 4312c of the metal layer 431c is moved due to the resonance effect. When the vibration portion 4312c is moved, the space of the compression chamber 45c is compressed and the gas in the compression chamber 45c is pushed to the fluid channels 4334c of the silicon wafer layer 433c. Please refer to FIG. 10C. When the piezoelectric component 44c drives the actuation portion 4331c of the silicon wafer layer 433c to move in an opposite direction, the vibration portion 4312c of the metal layer 431c is also driven and moved by the actuation portion 4331c, so that the gas can be transmitted through the fluid channels 4334c and thus forces the gas in convergence chamber 422c to enter into the compression chamber 45c through the through hole 4311c at the same time. Hence, when the actuation portion 4331c is driven upwardly by the piezoelectric component 44c again later, the volume of the compression chamber 45c dramatically increases, thereby generating a larger suction force to draw the gas into the compression chamber 45c. Through repeating the aforementioned steps mentioned in FIG. 10A to FIG. 10C, the actuation portion 4331c can be continually driven by the piezoelectric component 44c to move reciprocatingly, and the vibration portion 4312c is also driven to move reciprocatingly correspondingly. Thus, the internal pressure of the compression chamber 45c of the MEMS micro pump 4c can be changed periodically so as to draw and discharge the gas continually, thereby completing the pumping process of the MEMS micro pump 4c.

As above, the valve component 5 is covered on the gas actuator 4, and the valve unit 51 is correspondingly disposed on the inlet 411c of the MEMS micro pump 4c, so that when the gas actuator 4 and the valve component 5 are driven, the valve unit 51 is opened to control the gas introduction of the gas actuator 4, and the gas actuator 4 is actuated to transmit the gas to the ventilating channel 13 for gas collection, and the gas actuator 4 further transmits the gas to the gas bag 3 for inflating the gas bag 3, so that the gas bag 3 is expanded and protruded out of the wearing surface 11 of the earphone body 1 (as shown in FIG. 2B). Therefore, the earphone can be stably worn and attached to the user's ear portion. Alternatively, in another embodiment, as shown in FIG. 3A, the gas bag 3 is disposed in an attaching foam component 15 of a hanging-on type earphone. When gas bag 3 is inflated, the gas bag 3 is expanded and attached to the inner portion of the attaching foam component 15. Hence, the attaching foam component 15 can provide a better support function, so that the earphone can be stably worn and attached to the user's ear portion.

As discussed above, the earphone of one of some embodiments of the present disclosure has the gas actuator for inflating the gas bag to perform the positioning function, so that the earphone can be stably positioned and worn on the ear portion of the user.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An earphone, comprising:
   an earphone body having a wearing surface, wherein an inner portion of the earphone body has a base member and a ventilating channel;
   a loudspeaker embedded on the wearing surface of the earphone body;
   a gas bag disposed on an outer periphery of the wearing surface and being in communication with the ventilating channel;
   a gas actuator disposed on the base member of the earphone body, electrically connected to the earphone body, and being in communication with the ventilating channel, wherein when the gas actuator is driven, the gas actuator is actuated to transmit gas to the ventilating channel to perform a gas collecting operation; and
   a valve component having at least one valve unit, wherein the at least one valve unit includes a valve conductive layer, a valve substrate layer, and a flexible membrane, a receiving space is maintained between the valve conductive layer and the valve substrate layer, the flexible membrane is attached on a side of the valve conductive layer and is placed in the receiving space, and the at least one valve unit is driven to be opened or closed to control a gas introduction procedure of the gas actuator;
   wherein when the gas actuator and the valve component are driven, the at least one valve unit is opened to control the gas introduction procedure of the gas actuator, and the gas actuator is actuated to transmit the gas to the ventilating channel for gas collection, and the gas actuator further transmits the gas to the gas bag for inflating the gas bag, so that the gas bag is expanded and protruded out of the wearing surface of the earphone body, thereby allowing the earphone to be stably worn and attached to a user's ear portion.

2. The earphone according to claim 1, wherein the base member is a driving circuit board provided for electrically connecting to the gas actuator and the at least one valve unit of the valve component for outputting a driving signal.

3. An earphone, comprising:
   an earphone body having a wearing surface, wherein an inner portion of the earphone body has a base member and a ventilating channel;
   a loudspeaker embedded on the wearing surface of the earphone body;
   a gas bag disposed on an outer periphery of the wearing surface and being in communication with the ventilating channel;
   a gas actuator disposed on the base member of the earphone body, electrically connected to the earphone body, and being in communication with the ventilating channel, wherein when the gas actuator is driven, the gas actuator is actuated to transmit gas to the ventilating channel to perform a gas collecting operation; and
   a valve component having at least one valve unit, wherein the at least one valve unit is driven to be opened or closed to control a gas introduction procedure of the gas actuator;
   wherein when the gas actuator and the valve component are driven, the at least one valve unit is opened to control the gas introduction procedure of the gas actuator, and the gas actuator is actuated to transmit the gas to the ventilating channel for gas collection, and the gas actuator further transmits the gas to the gas bag for inflating the gas bag, so that the gas bag is expanded and protruded out of the wearing surface of the earphone body, thereby allowing the earphone to be stably worn and attached to a user's ear portion;

wherein the gas actuator is a micro pump, and the micro pump comprises:

an inlet plate having at least one inlet hole, at least one convergence channel, and a convergence chamber, wherein the at least one inlet hole is used to introduce the gas to flow into the micro pump, the at least one inlet hole correspondingly penetrates the at least one convergence channel, and the at least one convergence channel is converged at the convergence chamber, so that the gas introduced from the at least one inlet hole is converged at the convergence chamber;

a resonance sheet attached to the inlet plate, wherein the resonance sheet has a perforation, a movable portion, and a fixed portion, wherein the perforation is located at a center portion of the resonance sheet and corresponds to the convergence chamber of the inlet plate, the movable portion is disposed at a periphery of the perforation and is disposed at a portion corresponding to the convergence chamber, and the fixed portion is disposed at an outer periphery of the resonance sheet and attached to the inlet plate; and a piezoelectric actuator attached to the resonance sheet and disposed correspondingly to the resonance sheet;

wherein a chamber space is formed between the resonance sheet and the piezoelectric actuator, so that when the piezoelectric actuator is driven, the gas outside the micro pump is introduced into the micro pump through the at least one inlet hole of the inlet plate, converged at the convergence chamber via the at least one convergence channel, flowed through the perforation of the resonance sheet, and transmitted outwardly by a resonance effect resulting between the piezoelectric actuator and the movable portion of the resonance sheet.

4. The earphone according to claim 3, wherein the piezoelectric actuator comprises:

a suspension plate in square shape and capable of bending and vibrating;

an outer frame disposed around a periphery of the suspension plate;

at least one supporting element formed between the suspension plate and the outer frame to provide a flexible support for the suspension plate; and a piezoelectric element having a side length, wherein the side length of the piezoelectric element is smaller than or equal to a side length of the suspension plate, and the piezoelectric element is attached to a surface of the suspension plate so as to drive the suspension plate to bend and vibrate when the piezoelectric element is applied with a voltage.

5. The earphone according to claim 3, wherein the micro pump further comprises a first insulation sheet, a conductive sheet, and a second insulation sheet, and wherein the inlet plate, the resonance sheet, the piezoelectric actuator, the first insulation sheet, the conductive sheet, and the second insulation sheet are sequentially stacked with each other.

6. The earphone according to claim 3, wherein the piezoelectric actuator comprises:

a suspension plate in square shape and capable of bending and vibrating;

an outer frame disposed around a periphery of the suspension plate;

at least one supporting element formed between the suspension plate and the outer frame to provide a flexible support for the suspension plate, wherein a surface of the suspension plate and a surface of the outer frame are non-coplanar, so that a chamber space is formed between the surface of the suspension plate and the resonance sheet; and a piezoelectric element having a side length, wherein the side length of the piezoelectric element is smaller than or equal to a side length of the suspension plate, and the piezoelectric element is attached to a surface of the suspension plate so as to drive the suspension plate to bend and vibrate when the piezoelectric element is applied with a voltage.

7. An earphone, comprising:

an earphone body having a wearing surface, wherein an inner portion of the earphone body has a base member and a ventilating channel;

a loudspeaker embedded on the wearing surface of the earphone body;

a gas bag disposed on an outer periphery of the wearing surface and being in communication with the ventilating channel;

a gas actuator disposed on the base member of the earphone body, electrically connected to the earphone body, and being in communication with the ventilating channel, wherein when the gas actuator is driven, the gas actuator is actuated to transmit gas to the ventilating channel to perform a gas collecting operation; and a valve component having at least one valve unit, wherein the at least one valve unit is driven to be opened or closed to control a gas introduction procedure of the gas actuator;

wherein when the gas actuator and the valve component are driven, the at least one valve unit is opened to control the gas introduction procedure of the gas actuator, and the gas actuator is actuated to transmit the gas to the ventilating channel for gas collection, and the gas actuator further transmits the gas to the gas bag for inflating the gas bag, so that the gas bag is expanded and protruded out of the wearing surface of the earphone body, thereby allowing the earphone to be stably worn and attached to a user's ear portion;

wherein the gas actuator is a blower-type micro pump, and the blower-type micro pump comprises:

a nozzle plate comprising a suspension sheet and a hollow hole, wherein the suspension sheet is capable of bending and vibrating, and the hollow hole is formed at a center portion of the suspension sheet;

a chamber frame stacked on the nozzle plate;

an actuation body stacked on the chamber frame so as to bend and vibrate reciprocatingly when the actuation body is applied with a voltage;

an insulation frame stacked on the actuation body; and a conductive frame stacked on the insulation frame;

wherein the nozzle plate is fixedly disposed and positioned with positioning bumps in a gas-guiding loading region of the base member, so that a surrounding gap is defined between the nozzle plate and an inner edge of the gas-guiding loading region for the gas to flow therethrough, a gas flow chamber is formed between a bottom of the nozzle plate and the bottom of the gas-guiding loading region, and a resonance chamber is formed between the actuation body, the chamber frame, and the suspension sheet, and wherein the nozzle plate is capable of being driven to move correspondingly by driving the actuation body, so that the suspension sheet of the nozzle plate vibrates reciprocatingly, and thus the gas enters into the gas flow chamber through the surrounding gap and then is discharged out of the gas flow chamber, thereby achieving transmission of the gas.

8. The earphone according to claim 7, wherein the actuation body comprises:
a piezoelectric carrier plate stacked on the chamber frame;
an adjusting resonance plate stacked on the piezoelectric carrier plate; and
a piezoelectric plate stacked on the adjusting resonance plate so as to drive the piezoelectric carrier plate and the adjusting resonance plate to bend and vibrate reciprocatingly when the piezoelectric plate is applied with the voltage.

9. The earphone according to claim 1, wherein the gas actuator is a microelectromechanical systems (MEMS) micro pump, and the MEMS micro pump comprises:
a substrate formed with at least one inlet by etching;
an oxide layer formed and stacked on the substrate by deposition, wherein the oxide layer is formed with a plurality of convergence channels and a convergence chamber by etching, and the convergence channels are in communication between the at least one inlet of the substrate and the convergence chamber; and
a vibration layer formed and stacked on the oxide layer by deposition, wherein the vibration layer comprises:
a metal layer formed and stacked on the oxide layer by deposition, wherein the metal layer is formed with a through hole, a vibration portion, and a fixed portion by etching, the through hole is formed at a center portion of the metal layer, the vibration portion is formed on a periphery of the through hole, and the fixed portion is formed on a periphery of the metal layer;
a second oxide layer formed and stacked on the metal layer by deposition, wherein the second oxide layer is formed with an oxide layer hole by etching; and
a silicon wafer layer formed and stacked on the second oxide layer by deposition, wherein the silicon wafer layer is formed with an actuation portion, an outer peripheral portion, a plurality of connection portions, and a plurality of fluid channels by etching, wherein the actuation portion is formed at a center portion of the silicon wafer layer, the outer peripheral portion is formed around a periphery of the actuation portion, the connection portions are respectively connected between the actuation portion and the outer peripheral portion, and the fluid channels are respectively formed between the actuation portion and the outer peripheral portion and are respectively formed between the connection portions, and wherein a compression chamber is formed by the silicon wafer layer and the oxide layer hole of the second oxide layer; and
a piezoelectric component formed and stacked on the actuation portion of the silicon wafer layer by deposition, wherein the piezoelectric component comprises a lower electrode layer, a piezoelectric layer, an insulation layer, and an upper electrode layer, wherein the piezoelectric layer is formed and stacked on the lower electrode layer by deposition, the insulation layer is formed and stacked on a portion of a surface of the piezoelectric layer and on a portion of a surface of the lower electrode layer by deposition, the upper electrode layer is formed and stacked on the insulation layer and a remaining portion of the surface of the piezoelectric layer where the insulation layer is not disposed, and the upper electrode layer is provided for electrically connected to the piezoelectric layer.

\* \* \* \* \*